US012813096B2

(12) United States Patent
Jiang et al.

(10) Patent No.: US 12,813,096 B2
(45) Date of Patent: Nov. 24, 2026

(54) DISPLAY DEVICES WITH STRAY LIGHT PREVENTION MECHANISMS

(71) Applicant: Taiwan Semiconductor Manufacturing Company, Ltd., Hsinchu (TW)

(72) Inventors: Jheng-Hong Jiang, Hsinchu (TW); Shing-Huang Wu, Hsinchu (TW); Chia-Wei Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 671 days.

(21) Appl. No.: 18/171,282

(22) Filed: Feb. 17, 2023

(65) Prior Publication Data

US 2024/0081105 A1 Mar. 7, 2024

Related U.S. Application Data

(60) Provisional application No. 63/374,593, filed on Sep. 5, 2022.

(51) Int. Cl.
*H10K 59/126* (2023.01)
*H10K 59/12* (2023.01)
(Continued)

(52) U.S. Cl.
CPC ....... *H10K 59/126* (2023.02); *H10K 59/1201* (2023.02); *H10K 59/131* (2023.02); *G02B 1/11* (2013.01)

(58) Field of Classification Search
CPC ..... H10K 59/131; H10K 59/1201; G02B 1/11
See application file for complete search history.

(56) References Cited

U.S. PATENT DOCUMENTS 5,847,690 A * 12/1998 Boie ..................... G06F 3/0412 345/174
5,888,884 A * 3/1999 Wojnarowski .......... H10P 52/00 257/E21.597
(Continued)

FOREIGN PATENT DOCUMENTS

CN 109887963 A 6/2019
CN 114823400 A 7/2022
(Continued)

OTHER PUBLICATIONS

First office action received in the corresponding Taiwan application 112125127, mailed on Jun. 24, 2024.

*Primary Examiner* — Mohsen Ahmadi
(74) *Attorney, Agent, or Firm* — Kilpatrick Townsend & Stockton LLP

(57) ABSTRACT

A display device and method of manufacturing thereof is provided. The display device includes: a substrate; a plurality of control transistors disposed in the substrate; a multi-layer interconnect (MLI) structure on the substrate; and a luminous device layer disposed on the MLI structure. The luminous device layer includes a plurality of sub-pixels corresponding to the plurality of control transistors, respectively. The MLI structure includes a plurality of routing features and at least one light blocking feature, and the plurality of routing features electrically connect each of the plurality of control transistors to the corresponding sub-pixel, and the at least one light blocking feature is operable to block stray light generated by the luminous device layer.

20 Claims, 15 Drawing Sheets

(51) Int. Cl.
*H10K 59/131* (2023.01)
*G02B 1/11* (2015.01)

(56) References Cited

U.S. PATENT DOCUMENTS

| | | | | |
|---|---|---|---|---|
| 6,593,224 | B1 * | 7/2003 | Lin | H05K 3/4647 438/618 |
| 6,801,293 | B1 * | 10/2004 | Nishiyama | G02F 1/134363 349/187 |
| 11,451,256 | B1 * | 9/2022 | Beaulieu | H04M 1/185 |
| 2004/0207309 | A1 * | 10/2004 | Lesenco | H01J 31/127 313/495 |
| 2008/0129911 | A1 * | 6/2008 | Huang | G02F 1/136209 257/E27.113 |
| 2012/0091549 | A1 * | 4/2012 | Chou | H10F 39/024 257/E31.127 |
| 2013/0082342 | A1 * | 4/2013 | Lu | H10F 39/026 257/E31.127 |
| 2013/0134542 | A1 * | 5/2013 | Lu | H10F 39/011 257/E31.127 |
| 2013/0327921 | A1 * | 12/2013 | Chen | H10P 76/408 257/E31.127 |
| 2013/0329102 | A1 * | 12/2013 | Tsao | H10F 39/026 348/294 |
| 2014/0263958 | A1 * | 9/2014 | Her | H10F 39/024 250/208.1 |
| 2015/0249120 | A1 * | 9/2015 | Cheng | H10K 59/126 438/23 |
| 2017/0250219 | A1 * | 8/2017 | Bower | H10H 20/841 |
| 2018/0151645 | A1 * | 5/2018 | Lee | H10K 59/878 |
| 2019/0324341 | A1 * | 10/2019 | Tonar | B32B 27/365 |
| 2020/0174172 | A1 * | 6/2020 | Dong | G02B 1/111 |
| 2020/0321379 | A1 * | 10/2020 | Cheng | H10F 39/8053 |
| 2020/0395395 | A1 * | 12/2020 | Lee | H10F 39/028 |

FOREIGN PATENT DOCUMENTS

| | | | |
|---|---|---|---|
| CN | 114823761 | A | 7/2022 |
| TW | 200733022 | A | 9/2007 |

* cited by examiner

DISPLAY DEVICES WITH STRAY LIGHT PREVENTION MECHANISMS

CROSS-REFERENCE TO RELATED APPLICATIONS

The application claims priority to U.S. Provisional Patent Application 63/374,593 filed Sep. 5, 2022, entitled "Display Devices with Stray Light Prevention Mechanisms," the entire disclosure of which is incorporated herein by reference.

FIELD

Embodiments of the present disclosure relate generally to display devices, and more particularly to display devices with stray light prevention mechanisms.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
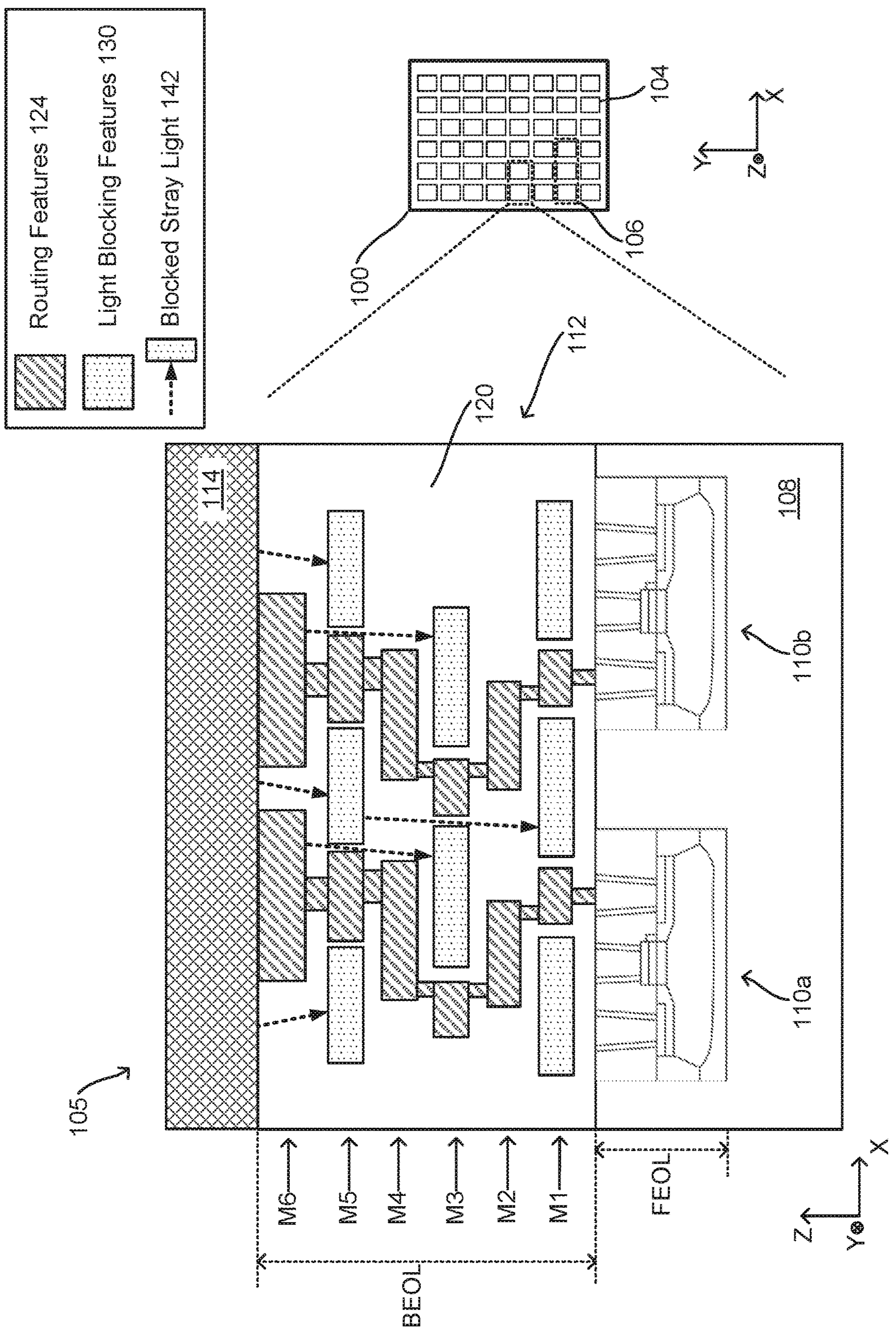
FIG. 1 is a diagram illustrating an example display device with light blocking features in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

A display device is an output device for the presentation of information in visual forms. Light-emitting diode (LED) displays, microLED displays, Mini LED displays, organic light-emitting diode (OLED) displays, and quantum-dot light-emitting diode (QD-LED) displays are among those display devices that have been developed.

Among these display devices, OLED displays are gaining more and more interest due to the improved image quality (e.g., better contrast, higher brightness, fuller viewing angle, a wider color range, and much faster refresh rates, as compared to LCD displays), the relatively low power consumption, the relatively simple design, the durability.

OLED displays can be used as components of, for example, near eye display (NED) devices (sometimes also referred to as "mounted displays" or "wearable displays"). A NED device may create a virtual image in the field of view of one or both eyes of a user. Just like that headphones and earbuds create a personal listening experience as compared to a speaker that creates a shared listening experience, a NED device creates small, portable, and personal viewing experiences as compared to a large screen like a television or a monitor.

NED devices have different categories, including immersive NED devices and see-through NED devices. Immersive NED devices block a user's view of the real world and create a large field of view image for the user instead. Immersive NED devices can be used for virtual reality (VR) and cinema glasses. See-through NED devices, on the other hand, leave a user's view almost intact and supplement it with a transparent or opaque image. See-through NED devices typically block only a small portion of the user's view of the real world, typically at its peripheral area. See-through NED devices can be used for augmented reality (AR) and smart glasses.

A problem associated with OLED displays is stray light. Stray light is light in the OLED display that was not intended in the design. The light may be from the intended source, but follow paths other than intended, or it may be from a source other than the intended source. The stray light often sets a working limit on the dynamic range of the OLED display. For example, the stray light limits the signal-to-noise ratio or contrast ratio, by limiting how dark the system can be. In addition, the stray light may propagate and reach control transistors fabricated using front-end-of-line (FEOL) processes because the dielectric layers fabricated using back-end-of-line (BEOL) processes are often transparent. Each of the control transistors provides a fine-tuned current that controls the light emitted by a red/green/blue (RGB) pixel (sometimes also referred to as a "sub-pixel"). The presence of the stray light may impact the behaviors of the carriers in the control transistors, thus impacting the light emitted by corresponding RGB pixels. Therefore, there is a need to prevent the stray light from reaching control transistors.

In accordance with some aspects of the disclosure, a display device is provided. The display device includes, among other components, a multi-layer interconnect (MLI) structure between a substrate and a luminous device layer. Routing features and light blocking features are disposed in the MLI structure. The routing features electrically connect control transistors fabricated in the substrate to corresponding sub-pixels. The light blocking features are operable to block stray light generated by the luminous device layer. The light blocking features are not electrically connected with the routing features.

In some embodiments, the MLI structure further includes at least one light absorbing layer operable to absorb the stray light. In some implementations, the at least one light absorbing layer includes at least one low reflectance layer comprising a material characterized by a relatively low reflectance as compared to a reflectance of the dielectric layers. In other implementations, the at least one light absorbing layer includes at least one anti-reflective layer characterized by multiple area enlarging elements operable to increase absorption of the stray light.

As a result of the light blocking features and the at least one light absorbing layer, the stray light is prevented from reaching the control transistors. The stability of the display device is enhanced accordingly.

Details of various aspects of the present disclosure will be described below with reference to FIGS. 1-9J. While OLED displays are used as an example throughout the disclosure, it should be understood that the techniques disclosed herein can be applied to other types of display devices such as QD-LED displays.

Display Device with Light Blocking Features

FIG. 1 is a diagram illustrating an example display device 100 with light blocking features in accordance with some embodiments. In one embodiment, the display device 100 is a near eye display that is configured to form an image, which is projected on the retinas of the user. In one embodiment, the display device 100 has a high resolution and low power consumption. In one example, the display device 100 has a high resolution of high definition (i.e., HD) with 1920 pixels in width and 1080 pixels in height. In other words, the display device 100 can present about two million pixels, corresponding to about six million sub-pixels (i.e., RGB pixels). In another example, the display device 100 has a high resolution of ultra-high definition (i.e., UHD or "4K") with 3840 pixels in width and 2160 pixels in height. In other words, the display device 100 can present about eight million pixels, corresponding to about twenty-four million RGB pixels. It should be understood that these examples are not intended to be limiting and the display device 100 can have other resolutions as needed.

In one embodiment, the display device 100 is opaque and fabricated on a silicon substrate. In other words, the display device 100 cannot be see-through, and the user interacts with the world based on the image projected on his or her retinas.

In the example shown in FIG. 1, the display device 100 has pixels 106 arranged in rows and columns in a horizontal plane (i.e., the X-Y plane shown in FIG. 1), and each pixel 106 includes three sub-pixels (i.e., RGB pixels) 104 corresponding to red, green, and blue, respectively.

In some implementations, a portion 105 (i.e., two sub-pixels 104) of the display device 100 has a structure as illustrated in the enlarged portion shown in FIG. 1. In the example shown in FIG. 1, the portion 105 includes, among other things, two control transistors 110*a* and 110*b* (collectively, "110"), a multi-layer interconnect (MLI) structure 112, and a luminous device layer 114.

The control transistors 110*a* and 110*b* are electrically connected to the luminous device layer 114 through the MLI structure 112 and drive and control the luminous device layer 114 by providing current sources. Specifically, the control transistor 110*a* is electrically connected to its corresponding luminous sub-pixel; the control transistor 110*b* is electrically connected to its corresponding luminous sub-pixel.

The control transistors 110 and 110*b* are transistors fabricated using FEOL processes on, for example, a substrate 108. In other words, the control transistors 110*a* and 110*b* are silicon-based transistors. In some examples, the control transistors 110*a* and 110*b* are fin field-effect transistors (FinFETs). In other examples, the control transistors 110*a* and 110*b* are gate-all-around (GAA) field-effect transistors (FETs). In yet other examples, the control transistors 110*a* and 110*b* are multi-bridge channel (MBC) field-effect transistors (FETs). It should be understood that these examples are not intended to be limiting and other types of transistors may be employed as well.

Each of the control transistors 110*a* and 110*b* is turned on by applying an appropriate voltage bias to the gate thereof. The currents provided by the control transistors 110 can be tuned by applying different voltage biases to the drains of the control transistors 110. The tuned currents provided by the control transistors 110 are used to control the corresponding luminous sub-pixels in the luminous device layer 114.

The MLI structure 112 includes a combination of dielectric layers 120 and routing features 124 in multiple conductive layers (M1, M2, M3, M4, M5, and M6 in the example shown in FIG. 1) configured to form various interconnect structures. The routing features 124 are configured to form vertical routing features (sometimes also referred to as "vertical interconnect features") (e.g., device-level contacts, vias, etc.) and horizontal routing features (sometimes also referred to as "horizontal interconnect features") (e.g., conductive lines or conductive tracks extending in the X-Y plane shown in FIG. 1). Vertical interconnect features typically connect horizontal interconnect features in different conductive layers (e.g., a first metal layer often denoted as "M1" and a fifth metal layer often denoted as "M5") of the MLI structure 112. It should be understood that although the MLI structure 112 is depicted in FIG. 1 with a given number of dielectric layers 120 and conductive layers, the present disclosure contemplates MLI structures having more or fewer dielectric layers 120 and/or conductive layers depending on design requirements.

In some embodiments, the dielectric layers 120 may comprise low-k dielectric materials (materials having a dielectric constant lower than silicon dioxide). In other embodiments, the dielectric layers 120 may comprise extremely low-k (ELK) dielectric materials (materials having a dielectric constant lower than 3.9). In some examples, the dielectric layers 120 may comprise silicon nitride ($Si_3N_4$), undoped silicon glass (USG), phosphosilicate glass (PSG), and silicon oxynitride ($SiN_xO_y$).

The luminous device layer 114 is disposed on the top surface of the MLI structure 112. The luminous device layer 114 receives the currents provided by the control transistors 110 through the MLI structure 112. Since the currents are stable and can be fine-tuned, the intensity or luminance of the sub-pixels 104 in the luminous device layer 114 can be fine-tuned and stay stable as well.

In one embodiment, the luminous device layer 114 is an organic light-emitting diode (OLED) layer. The OLED layer has a multi-layer structure, including a cathode layer, an organic emitter layer, an anode layer, and a glass layer, among other components. The organic emitter layer is an emissive electroluminescent layer which is a film of organic material that emits light in response to the currents provided by the control transistors 110. The film of organic material is situated between two electrodes (i.e., the cathode layer and the anode layer). The structure is sometimes referred to as "a matrix of anode and cathode layers." In order for the light to escape from the OLED, at least one of the electrodes is transparent.

The organic molecules are electrically conductive as a result of delocalization of pi electrons caused by conjugation over part or all of the molecule. These organic materials have conductivity levels ranging from insulators to conductors, and are therefore considered organic semiconductors. The highest occupied and lowest unoccupied molecular orbitals (i.e., HOMO and LUMO) of organic semiconductors are analogous to the valence and conduction bands of inorganic semiconductors such as silicon, gallium nitride, silicon carbide, and the like. The organic material in each sub-pixel 104 can be individually energized using the matrix of anode and cathode layers, and the corresponding light is emitted accordingly.

Unlike LEDs, which are small-point light sources, OLEDs are often made in sheets that are diffuse-area light sources. The diffuse light from OLEDs allows them to be used very close to the eyes of a user without creating glare for the user, and, therefore, less total light is needed in order to achieve desired illuminance levels.

The color emitted from the OLED is determined by the type of organic material used. In some embodiments, the OLED is a small-molecule OLED (SM-OLED), and the organic material used is small molecules such as organometallic chelates, fluorescent and phosphorescent dyes and conjugated dendrimers. The production of SM-OLEDs often involves thermal evaporation in a vacuum, which enables the formation of well-controlled and homogeneous films, and the construction of complex multi-layer structures. In other implementations, the sub-pixels 104 are formed at once by printing, during which the necessary quantity of materials is put onto target places.

In other embodiments, the OLED is a polymer light-emitting diode (PLED or P-OLED), and the organic material used is an electroluminescent conductive polymer that emits light when connected to an external voltage. Unlike SM-OLEDs, thermal evaporation in a vacuum is not needed. Polymers can be processed in solution, and spin coating is often used for depositing thin polymer films. P-OLEDs are quite efficient and require a relatively small amount of power for the amount of light produced.

As shown in FIG. 1 and mentioned above, the presence of some stray light will negatively impact the control transistors 110, thereby reducing the stability of the display device 100. To address the issues caused by the presence of some stray light, light blocking features 130 are introduced in the MLI structure 112. In the example shown in FIG. 1, the light blocking features 130 are disposed in three conductive layers, namely the M1 layer, the M3 layer, and the M5 layer. As shown in FIG. 1, the light blocking features 130 are operable to block stray light propagating from the top of the MLI structure 112 to the bottom of the MLI structure 112. Specifically, the light blocking features 130 in the M5 layer are operable to block the stray light propagating through the gaps between two neighboring ones of the routing features 124 in the M6 layer (the "top metal layer" in the example shown in FIG. 1). Even if there is still some stray light propagating through the light blocking features 130 in the M5 layer, the light blocking features 130 in the M3 layer are operable to block the stray light propagating through the gaps between two neighboring ones of the routing features 124 in the M4 layer. Likewise, even if there is still some stray light propagating through the light blocking features 130 in the M3 layer, the light blocking features 130 in the M1 layer are operable to block the stray light propagating through the gaps between two neighboring ones of the routing features 124 in the M2 layer. The blocked stray light 142 is denoted as the dashed arrows in FIG. 1.

As such, the light blocking features 130 disposed in the M5 layer serve as the first line of defense to prevent the stray light from reaching the control transistors 110; the light blocking features 130 disposed in the M3 layer serve as the second line of defense to prevent the stray light from reaching the control transistors 110; the light blocking features 130 disposed in the M1 layer serve as the third line of defense to prevent the stray light from reaching the control transistors 110. Therefore, the light blocking features 130 in the M5 layer, the M3 layer, and the M1 layer, collectively, significantly prevent the stray light from reaching the control transistors 110. The stability of the display device 100 is enhanced accordingly.

In some embodiments, the routing features 124 may comprise Ti. In some embodiments, the routing features 124 may comprise Ta. In some embodiments, the routing features 124 may comprise Al. In some embodiments, the routing features 124 may comprise AlCu. In some embodiments, the routing features 124 may comprise AlSiCu. In some embodiments, the routing features 124 may comprise Cu. In some embodiments, the routing features 124 may comprise W.

In some implementations, the light blocking features 130 may comprise the same material as the routing features 124. In some examples, the light blocking features 130 may comprise Ti, Ta, Al, AlCu, AlSiCu, Cu, or W. Since the light blocking features 130 may comprise the same material as the routing features 124, they can be fabricated simultaneously (i.e., in the same step using one mask) in a cost-effective manner. The difference lies in that the routing features are electrically connected between at least one of the control transistors 110 and the luminous device layer 114, whereas the light blocking features 130 are not (sometimes referred to as “floating features” in the MLI structure 112). In other implementations, the light blocking features 130 and the routing features 124 may comprise different materials.

While the light blocking features 130 are disposed in the M1 layer, the M3 layer, and the M5 layer in this example shown in FIG. 1, this is not intended to be limiting, and other configurations can be employed as needed. In one embodiment, the light blocking features 130 are disposed in all even-numbered conductive layers (i.e., the M2 layer, the M4 layer, the M6 layer, the M8 layer, . . . ). In another embodiment, the light blocking features 130 are disposed in a portion of the even-numbered conductive layers (e.g., the M2 layer, the M6 layer, the M8 layer, . . . ). In yet another embodiment, the light blocking features 130 are disposed in all odd-numbered conductive layers (i.e., the M1 layer, the M3 layer, the M5 layer, the M7 layer, . . . ). In still another embodiment, the light blocking features 130 are disposed in a portion of the odd-numbered conductive layers (e.g., the M1 layer, the M5 layer, the M7 layer, . . . ). In another embodiment, the light blocking features 130 are disposed in a portion of all conductive layers (i.e., the M1 layer, the M2 layer, the M7 layer, the M8 layer, . . . ).

Figure 3A:
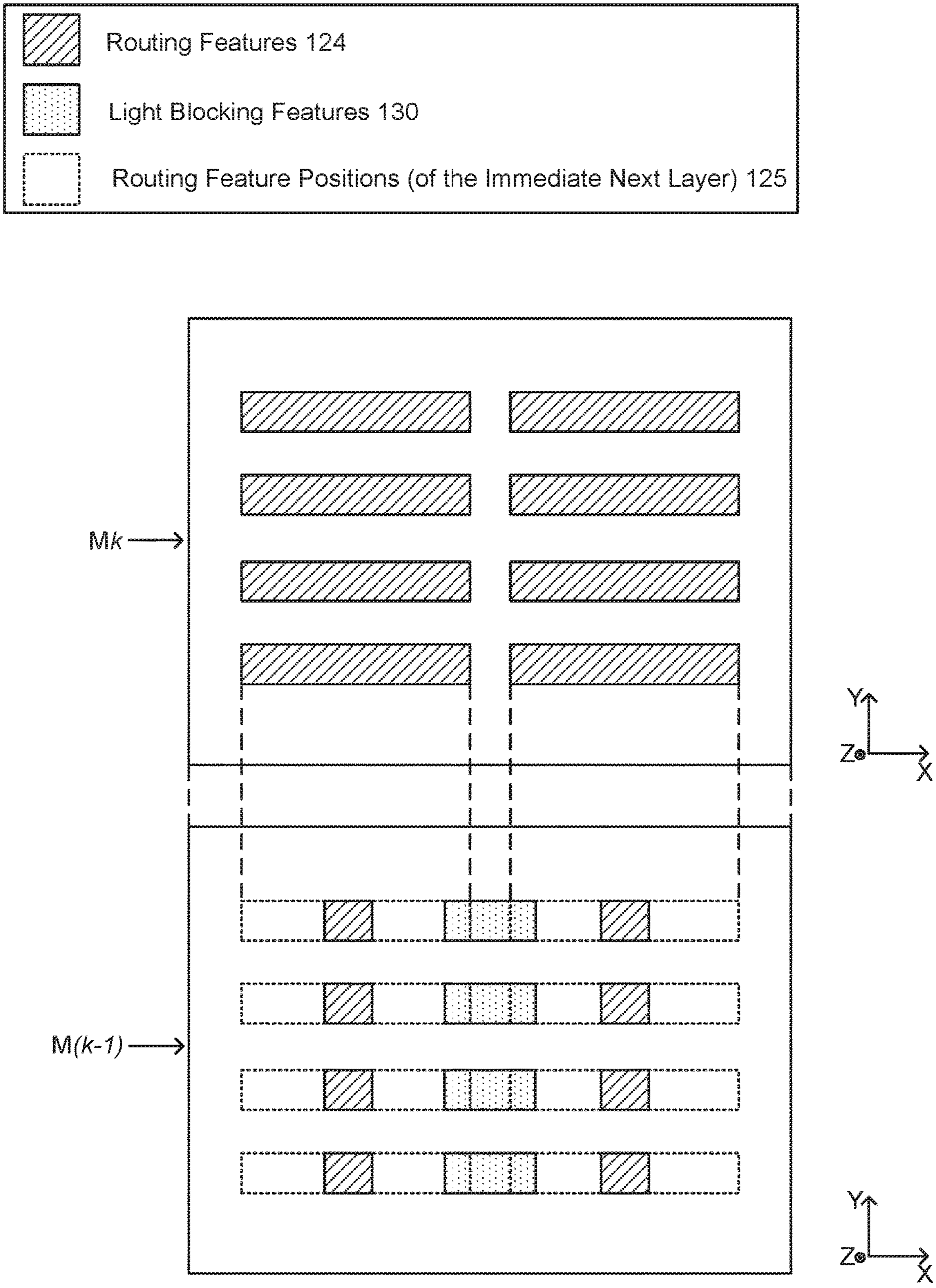
FIG. 3A is a diagram illustrating an example configuration of the light blocking features in accordance with some embodiments.
Figure 3B:
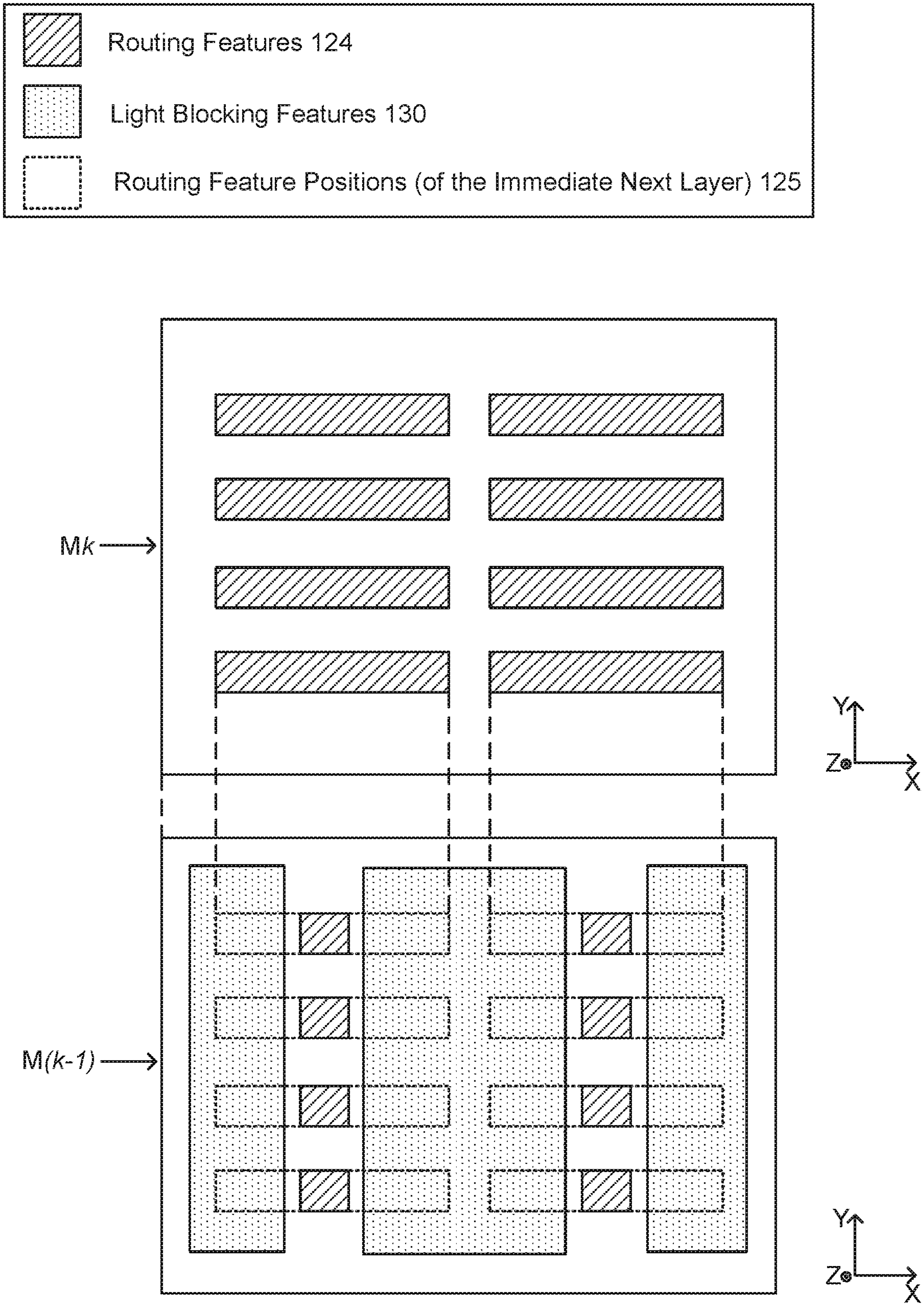
FIG. 3B is a diagram illustrating another example configuration of the light blocking features in accordance with some embodiments.

FIG. 3A is a diagram illustrating an example configuration of the light blocking features 130 in accordance with some embodiments. The top of FIG. 3A is the layout of the Mk layer (i.e., the kth conductive layer, k is an integer greater than one); the bottom of FIG. 3A is the layout of the M(k−1) layer (i.e., the (k−1)th conductive layer). For example, when k is five, the top of FIG. 3A is the layout of the M5 layer, while the bottom of FIG. 3B is the layout of the M4 layer. In other words, the top of FIG. 3A is the layout of a conductive layer that is the immediate next layer of the conductive layer of the bottom of FIG. 3B.

In the example shown in FIG. 3A, (horizontal) routing features 124 are disposed in the Mk layer, and there are gaps between two neighboring routing features 124. On the other hand, (vertical) routing features 124 are disposed in the M(k−1) layer. In addition, light blocking features 130 are disposed in the M(k−1) layer as well, and the light blocking features 130 are under the gaps in the first horizontal direction (i.e., the X-direction shown in FIG. 3A) between two neighboring (horizontal) routing features 124 in the Mk layer. As such, the light blocking features 130 disposed in the M(k−1) layer are operable to block stray light propagating through these gaps in the X-direction between two neighboring (horizontal) routing features 124 in the Mk layer. It should be understood that there may be other light blocking features 130 in other conductive layers not shown in FIG. 3A.

FIG. 3B is a diagram illustrating another example configuration of the light blocking features 130 in accordance with some embodiments. The example shown in FIG. 3B is similar to that shown in FIG. 3A except that the light blocking features 130 disposed in the M(k−1) layer have larger areas in the X-Y plane and occupy more area in the X-Y plane. In one embodiment, the areas of the light blocking features 130 disposed in the M(k−1) layer are designed to be as large as possible, subject to the minimum distance requirement between the light blocking features 130 and the (vertical) routing features 124. As such, the light blocking features 130 disposed in the M(k−1) layer are operable to block stray light propagating through the gaps in the X-direction and a portion of the gaps in the second horizontal direction (i.e., the Y-direction shown in FIG. 3B) between two neighboring (horizontal) routing features 124 in the Mk layer. Again, it should be understood that there may be other light blocking features 130 in other conductive layers not shown in FIG. 3A.

It should be understood that the examples shown in FIGS. 3A-3B are exemplary rather than limiting. The light blocking features 130 disposed in at least one conductive layer can be arranged in various configurations as needed. In one example, the light blocking features disposed in the M1 layer and the light blocking features disposed in the M3 layer are aligned vertically (i.e., have the same layout in the X-Y plane), while the routing features 124 disposed in the M2 layer and the routing features 124 disposed in the M4 layer are aligned vertically. In another example, the light blocking features disposed in the M2 layer and the light blocking features disposed in the M4 layer are aligned vertically, while the routing features 124 disposed in the M3 layer and the routing features 124 disposed in the M5 layer are aligned vertically. One of ordinary skill in the art would recognize many variations, modifications, and alternatives.

Figure 2:
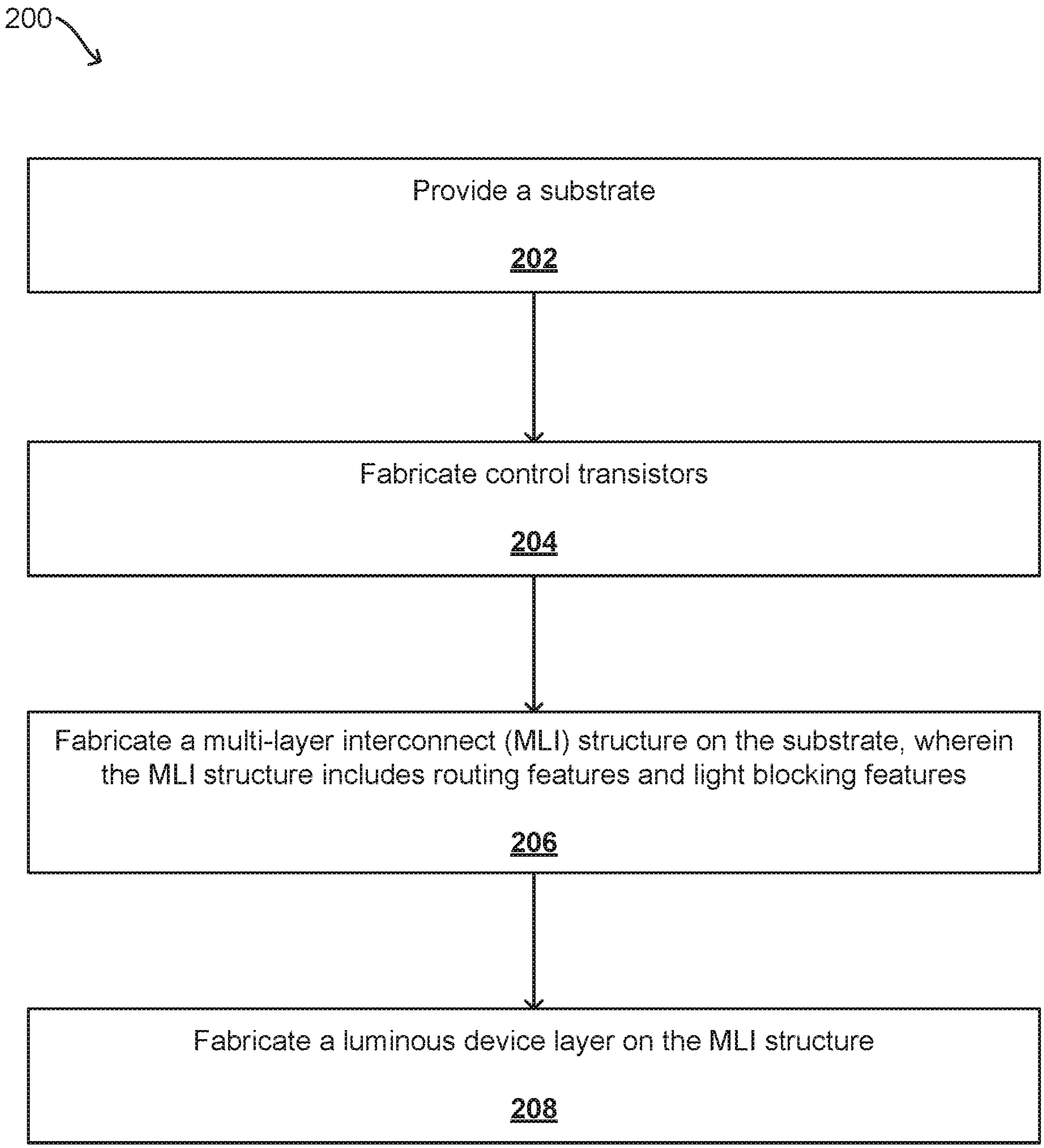
FIG. 2 is a flowchart diagram illustrating an example method for fabricating a display device with light blocking features in accordance with some embodiments.

FIG. 2 is a flowchart diagram illustrating an example method for fabricating a display device with light blocking features in accordance with some embodiments. In the example shown in FIG. 2, the method 200 includes operations 202, 204, 206, and 208. Additional operations may be performed.

At operation 202, a substrate (e.g., the substrate 108 shown in FIG. 1) is provided. In one embodiment, the substrate is a silicon substrate. It should be understood that other types of substrates may be employed in other embodiments.

At operation 204, control transistors (e.g., the control transistors 110*a* and 110*b* shown in FIG. 1) are fabricated using FEOL processes in the substrate. The number of control transistors corresponds to the number of sub-pixels. In some examples, the control transistors are FinFETs. In other examples, the control transistors are GAA FETs. In yet other examples, the control transistors are MBC FETs. It should be understood that these examples are not intended to be limiting and other types of transistors may be employed as well.

At operation 206, an MLI structure (e.g., the MLI structure 112 shown in FIG. 1) is fabricated on the substrate. The MLI structure includes both routing features (e.g., the routing features 124 shown in FIG. 1) and light blocking features (e.g., the light blocking features 130 shown in FIG. 1). The light blocking features are operable to block the stray light or prevent the stray light from reaching the control transistors.

At operation 208, a luminous device layer (e.g., the luminous device layer 114 shown in FIG. 1) is fabricated on the MLI structure. The luminous device layer receives the currents provided by the control transistors through the MLI structure. In one embodiment, the luminous device layer is an OLED layer. In some embodiments, the OLED layer has a multi-layer structure, including a cathode layer, an organic emitter layer, an anode layer, and a glass layer, among other components. The organic emitter layer is an emissive electroluminescent layer which is a film of organic material that emits light in response to the currents provided by the control transistors. The film of organic material is situated between two electrodes (i.e., the cathode layer and the anode layer).

Display Device with Light Blocking Features and Low Reflectance Layers

Figure 4:
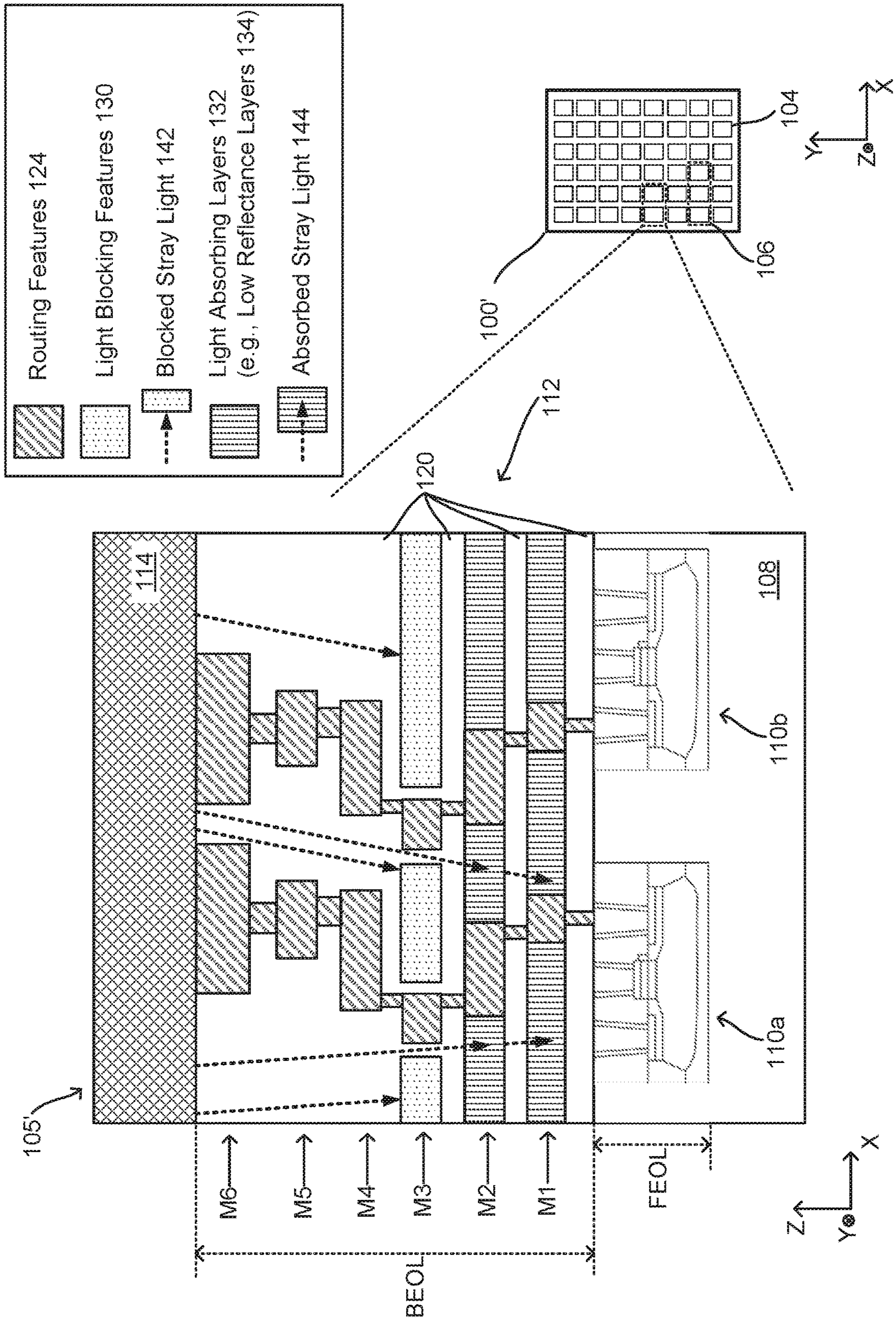
FIG. 4 is a diagram illustrating an example display device with light blocking features in accordance with some embodiments.

FIG. 4 is a diagram illustrating an example display device 100' with light blocking features in accordance with some embodiments. The display device 100' is similar to the display device 100 shown in FIG. 1 except that the MLI structure 112 includes light absorbing layers 132 (e.g., low reflectance layers 134). Components that are identical to or similar to those of the display device 100 will not be repeated.

In the example shown in FIG. 4, the display device 100' has pixels 106 arranged in rows and columns in the X-Y plane, and each pixel 106 includes three sub-pixels 104 corresponding to red, green, and blue, respectively. In some implementations, a portion 105' (i.e., two sub-pixels 104) of the display device 100' has a structure as illustrated in the enlarged portion shown in FIG. 4. In the example shown in FIG. 4, the portion 105' includes, among other things, two control transistors 110*a* and 110*b* (collectively, "110"), an MLI structure 112, and a luminous device layer 114.

Likewise, the MLI structure 112 includes a combination of dielectric layers 120 and routing features 124 in multiple conductive layers (M1, M2, M3, M4, M5, and M6 in the example shown in FIG. 4) configured to form various interconnect structures. The routing features 124 are configured to form vertical interconnect features (e.g., device-level contacts, vias, etc.) and horizontal interconnect features (e.g., conductive lines or conductive tracks extending in the X-Y plane shown in FIG. 4). Vertical interconnect features typically connect horizontal interconnect features in different conductive layers of the MLI structure 112. It should be understood that although the MLI structure 112 is depicted in FIG. 4 with a given number of dielectric layers 120 and conductive layers, the present disclosure contemplates MLI structures having more or fewer dielectric layers 120 and/or conductive layers depending on design requirements.

In some embodiments, the dielectric layers 120 may comprise low-k dielectric materials (materials having a dielectric constant lower than silicon dioxide). In other embodiments, the dielectric layers 120 may comprise extremely low-k (ELK) dielectric materials (materials having a dielectric constant lower than 3.9). In some examples, the dielectric layers 120 may comprise silicon nitride ($Si_3N_4$), undoped silicon glass (USG), phosphosilicate glass (PSG), and silicon oxynitride ($SiN_xO_y$).

As shown in FIG. 4 and mentioned above, the presence of some stray light will negatively impact the control transistors 110, thereby reducing the stability of the display device 100'. To address the issues caused by the presence of some stray light, both light blocking features 130 and light absorbing layers 132 are introduced in the MLI structure 112. In the embodiment shown in FIG. 4, the light absorbing layers 132 are low reflectance layers 134.

The light blocking features 130 shown in FIG. 4 function in the same manner as those shown in FIG. 1. The light blocking features 130 are operable to block stray light propagating from the top of the MLI structure 112 to the bottom of the MLI structure 112. While the light blocking features 130 are disposed in the M3 layer in the example shown in FIG. 4, it should be understood that this is not intended to be limiting, and the light blocking features 130 may be disposed in multiple conductive layers (e.g., the M3 layer and the M5 layer). Also, various designs described above with reference to FIGS. 1 and 3A-3B are also applicable to the light blocking features 130 shown in FIG. 4 and, therefore, will not be repeated.

Unlike the example shown in FIG. 1, the MLI structure 112 shown in FIG. 4 includes two light absorbing layers 132. In the embodiment shown in FIG. 4, the light absorbing layers 132 are low reflectance layers 134. The low reflectance layers 134 are disposed in conductive layers (e.g., the M1 layer and the M2 layer in the example shown in FIG. 4) under the layer(s) (e.g., the M3 layer in the example shown in FIG. 4) where the light blocking features 130 are disposed. Each of the low reflectance layers 134 comprises a material characterized by a relatively low reflectance as compared to the reflectance of the dielectric layer 120. In one embodiment, each of the low reflectance layers 134 comprises silicon oxynitride ($SiN_xO_y$). $SiN_xO_y$ is the intermediate phase between silicon dioxide ($SiO_2$) and silicon nitride ($Si_3N_4$) and has tunable optical and electrical performance. By varying the chemical composition of $SiN_xO_y$, during the fabrication process, its reflectance and dielectric constant can be tuned. In one example, each of the low reflectance layers 134 comprises oxygen-rich $SiN_xO_y$. In one example, each of the low reflectance layers 134 comprises nitrogen-rich $SiN_xO_y$.

As shown in FIG. 4, the low reflectance layers 134 disposed in the M1 layer and the M2 layer are operable to absorb the stray light that propagates through or penetrates the light blocking features 130 disposed in the M3 layer. Specifically, the light blocking features 130 in the M3 layer are operable to block the stray light (denoted as the blocked stray light 142 in FIG. 4) propagating through the gaps between two neighboring ones of the routing features 124 in the M4 layer. Even if there is still some stray light propagating through the light blocking features 130 in the M3 layer, the low reflectance layer 134 disposed in the M2 layer is operable to absorb the stray light (denoted as the absorbed stray light 144 in FIG. 4). Likewise, even if there is still some stray light propagating through the low reflectance layer 134 disposed in the M2 layer, the low reflectance layer 134 disposed in the M1 layer is operable to absorb the stray light (denoted as the absorbed stray light 144 in FIG. 4).

As such, the light blocking features 130 disposed in the M3 layer serve as the first line of defense to prevent the stray light from reaching the control transistors 110; the low reflectance layer 134 disposed in the M2 layer serves as the second line of defense to prevent the stray light from reaching the control transistors 110; the low reflectance layer 134 disposed in the M1 layer serves as the third line of defense to prevent the stray light from reaching the control transistors 110. Therefore, the light blocking features 130 disposed in the M3 layer and the low reflectance layers 134 disposed in the M2 and M1 layers, collectively, significantly prevent the stray light from reaching the control transistors 110. The stability of the display device 100' is enhanced accordingly.

In some embodiments, the routing features 124 may comprise Ti. In some embodiments, the routing features 124 may comprise Ta. In some embodiments, the routing features 124 may comprise Al. In some embodiments, the routing features 124 may comprise AlCu. In some embodiments, the routing features 124 may comprise AlSiCu. In some embodiments, the routing features 124 may comprise Cu. In some embodiments, the routing features 124 may comprise W.

In some implementations, the light blocking features 130 may comprise the same material as the routing features 124. In some examples, the light blocking features 130 may comprise Ti, Ta, Al, AlCu, AlSiCu, Cu, or W. Since the light blocking features 130 may comprise the same material as the routing features 124, they can be fabricated simultaneously (i.e., in the same step using one mask) in a cost-effective manner. As explained above, the difference lies in that the routing features are electrically connected between at least one of the control transistors 110 and the luminous device layer 114, whereas the light blocking features 130 are not (sometimes referred to as "floating features" in the MLI structure 112). In other implementations, the light blocking features 130 and the routing features 124 may comprise different materials.

In some embodiments, the dielectric layers 120 may comprise low-k dielectric materials (materials having a dielectric constant lower than silicon dioxide). In other embodiments, the dielectric layers 120 may comprise extremely low-k (ELK) dielectric materials (materials having a dielectric constant lower than 3.9). In some examples, the dielectric layers 120 may comprise silicon nitride ($Si_3N_4$), undoped silicon glass (USG), phosphosilicate glass (PSG), silicon oxynitride ($SiN_xO_y$).

While the low reflectance layers 134 are disposed in the M2 layer and the M1 layer in the example shown in FIG. 4, this is not intended to be limiting, and other configurations can be employed as needed. In one embodiment, a single low reflectance layer 134 is disposed in the MLI structure 112. In another embodiment, more than two low reflectance layers 134 are disposed in the MLI structure 112. In some embodiments, the light block features 130 are disposed in the immediate next conductive layer (e.g., the M3 layer in the example shown in FIG. 4) of the top layer (e.g., the M2 layer in the example shown in FIG. 4) of the low reflectance layers 134. In other embodiments, the light block features 130 are not disposed in the immediate next conductive layer (e.g., the M3 layer in the example shown in FIG. 4) of the top layer (e.g., the M2 layer in the example shown in FIG. 4) of the low reflectance layers 134. In other words, there is a "gap" between the conductive layer(s) where the light blocking features 130 are disposed and the top layer of the lower reflectance layers 134. One of ordinary skill in the art would recognize many variations, modifications, and alternatives.

Also, like the concepts shown in FIGS. 3A-3B, the low reflectance layers 134 may extend in both the X-direction and the Y-direction shown in FIG. 4 as needed. In one embodiment, the low reflectance layers 134 occupy the whole area of the conductive layers (e.g., the M1 layer and the M2 layer in the example shown in FIG. 4) in the X-Y plane except areas where the routing features 124 are disposed.

Figure 5:
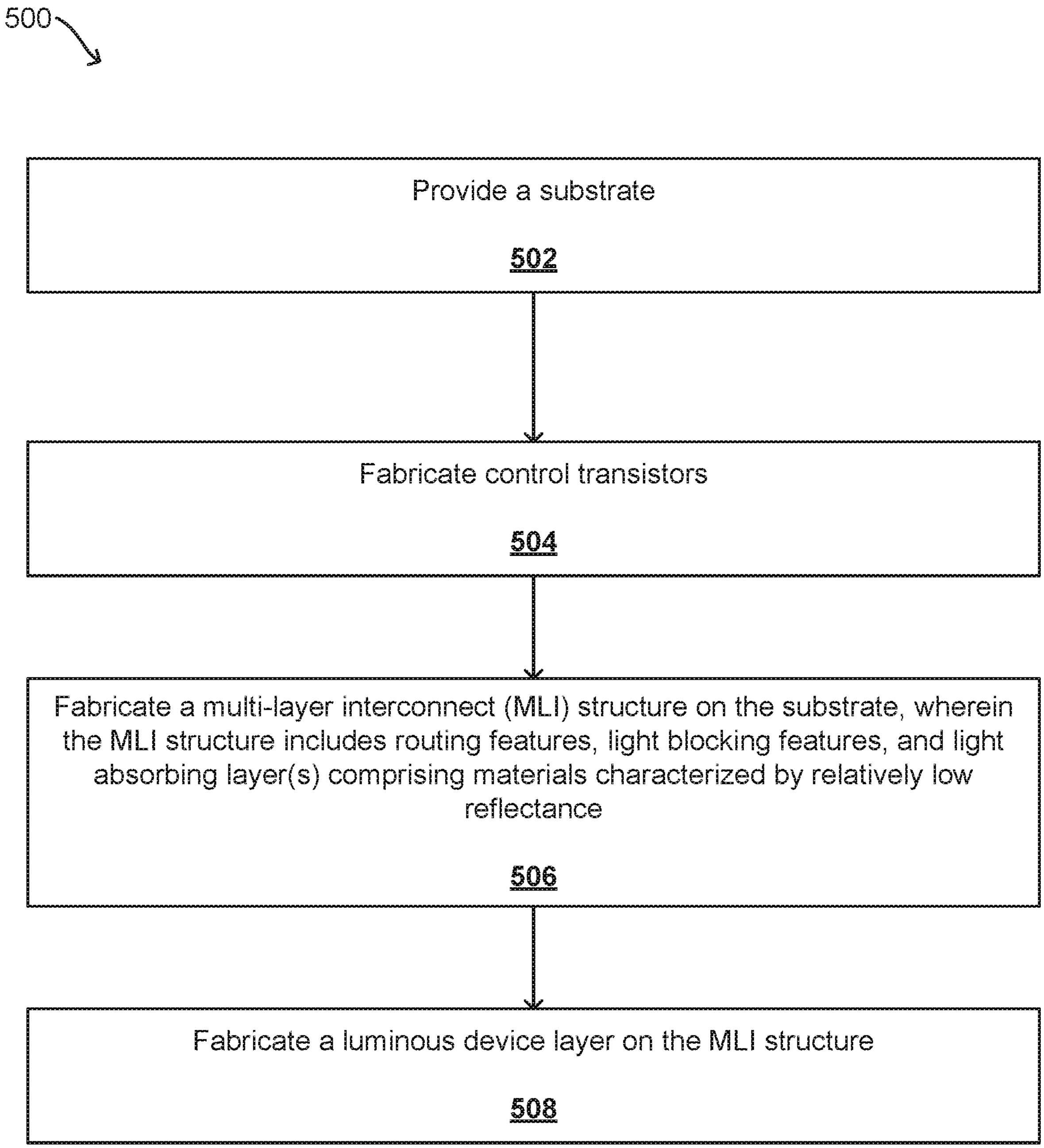
FIG. 5 is a flowchart diagram illustrating an example method for fabricating a display device with light blocking features and low reflectance layers in accordance with some embodiments.

FIG. 5 is a flowchart diagram illustrating an example method for fabricating a display device with light blocking features and low reflectance layers in accordance with some embodiments. In the example shown in FIG. 5, the method 500 includes operations 502, 504, 506, and 508. Additional operations may be performed.

At operation 502, a substrate (e.g., the substrate 108 shown in FIG. 4) is provided. In one embodiment, the substrate is a silicon substrate. It should be understood that other types of substrates may be employed in other embodiments.

At operation 504, control transistors (e.g., the control transistors 110*a* and 110*b* shown in FIG. 4) are fabricated using FEOL processes in the substrate. The number of control transistors corresponds to the number of sub-pixels. In some examples, the control transistors are FinFETs. In other examples, the control transistors are GAA FETs. In yet other examples, the control transistors are MBC FETs. It should be understood that these examples are not intended to be limiting and other types of transistors may be employed as well.

At operation 506, an MLI structure (e.g., the MLI structure 112 shown in FIG. 4) is fabricated on the substrate. The MLI structure includes routing features (e.g., the routing features 124 shown in FIG. 4), light blocking features (e.g., the light blocking features 130 shown in FIG. 4), and low reflectance layers (e.g., the low reflectance layers 134 shown in FIG. 4). The light blocking features and the low reflectance layers are operable to block the stray light or prevent the stray light from reaching the control transistors. The low reflectance layers are disposed in conductive layers under the conductive layers where the light blocking features are disposed.

At operation 508, a luminous device layer (e.g., the luminous device layer 114 shown in FIG. 4) is fabricated on the MLI structure. The luminous device layer receives the currents provided by the control transistors through the MLI structure. In one embodiment, the luminous device layer is an OLED layer. In some embodiments, the OLED layer has a multi-layer structure, including a cathode layer, an organic emitter layer, an anode layer, and a glass layer, among other components. The organic emitter layer is an emissive electroluminescent layer which is a film of organic material that emits light in response to the currents provided by the control transistors. The film of organic material is situated between two electrodes (i.e., the cathode layer and the anode layer).

Display Device with Light Blocking Features and Anti-Reflective Layers

Figure 6:
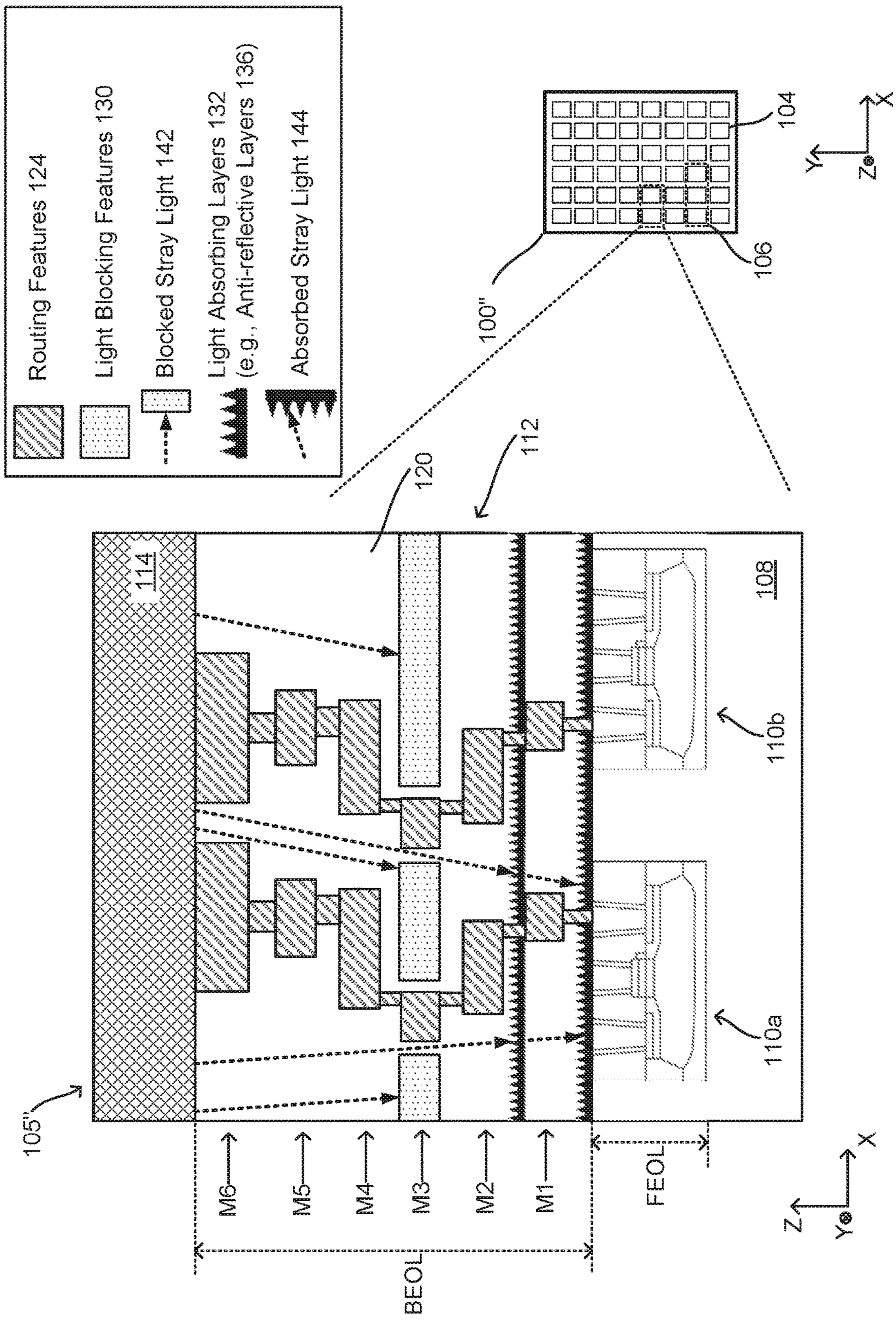
FIG. 6 is a diagram illustrating an example display device with light blocking features in accordance with some embodiments.

FIG. 6 is a diagram illustrating an example display device 100" with light blocking features in accordance with some embodiments. The display device 100" is similar to the display device 100 shown in FIG. 1 except that the MLI structure 112 includes light absorbing layers 132 (e.g., anti-reflective layers 136). Components that are identical to or similar to those of the display device 100 will not be repeated.

In the example shown in FIG. 6, the display device 100" has pixels 106 arranged in rows and columns in the X-Y plane, and each pixel 106 includes three sub-pixels 104 corresponding to red, green, and blue, respectively. In some implementations, a portion 105" (i.e., two sub-pixels 104) of the display device 100" has a structure as illustrated in the enlarged portion shown in FIG. 4. In the example shown in FIG. 4, the portion 105" includes, among other things, two control transistors 110*a* and 110*b* (collectively, "110"), an MLI structure 112, and a luminous device layer 114.

Likewise, the MLI structure 112 includes a combination of dielectric layers 120 and routing features 124 in multiple conductive layers (M1, M2, M3, M4, M5, and M6 in the example shown in FIG. 6) configured to form various interconnect structures. The routing features 124 are configured to form vertical interconnect features (e.g., device-level contacts, vias, etc.) and horizontal interconnect features (e.g., conductive lines or conductive tracks extending in the X-Y plane shown in FIG. 6). Vertical interconnect features typically connect horizontal interconnect features in different conductive layers of the MLI structure 112. It should be understood that although the MLI structure 112 is depicted in FIG. 6 with a given number of dielectric layers 120 and conductive layers, the present disclosure contemplates MLI structures having more or fewer dielectric layers 120 and/or conductive layers depending on design requirements.

In some embodiments, the dielectric layers 120 may comprise low-k dielectric materials (materials having a dielectric constant lower than silicon dioxide). In other embodiments, the dielectric layers 120 may comprise extremely low-k (ELK) dielectric materials (materials having a dielectric constant lower than 3.9). In some examples, the dielectric layers 120 may comprise silicon nitride ($Si_3N_4$), undoped silicon glass (USG), phosphosilicate glass (PSG), and silicon oxynitride ($SiN_xO_y$).

As shown in FIG. 6 and mentioned above, the presence of some stray light will negatively impact the control transistors 110, thereby reducing the stability of the display device 100". To address the issues caused by the presence of some stray light, both light blocking features 130 and light absorbing layers 132 are introduced in the MLI structure 112. In the embodiment shown in FIG. 6, the light absorbing layers 132 are anti-reflective layers 136.

The light blocking features 130 shown in FIG. 6 function in the same manner as those shown in FIG. 1. The light blocking features 130 are operable to block stray light propagating from the top of the MLI structure 112 to the bottom of the MLI structure 112. While the light blocking features 130 are disposed in the M3 layer in the example shown in FIG. 6, it should be understood that this is not intended to be limiting, and the light blocking features 130 may be disposed in multiple conductive layers (e.g., the M3 layer and the M5 layer). Also, various designs described above with reference to FIGS. 1 and 3A-3B are also applicable to the light blocking features 130 shown in FIG. 6 and, therefore, will not be repeated.

Unlike the example shown in FIG. 1, the MLI structure 112 shown in FIG. 6 includes two light absorbing layers 132. In the embodiment shown in FIG. 6, the light absorbing layers 132 are anti-reflective layers 136. The anti-reflective layers 136 are disposed in conductive layers (e.g., the M1 layer and the M2 layer in the example shown in FIG. 6) under the layer(s) (e.g., the M3 layer in the example shown in FIG. 6) where the light blocking features 130 are disposed.

Figure 7:
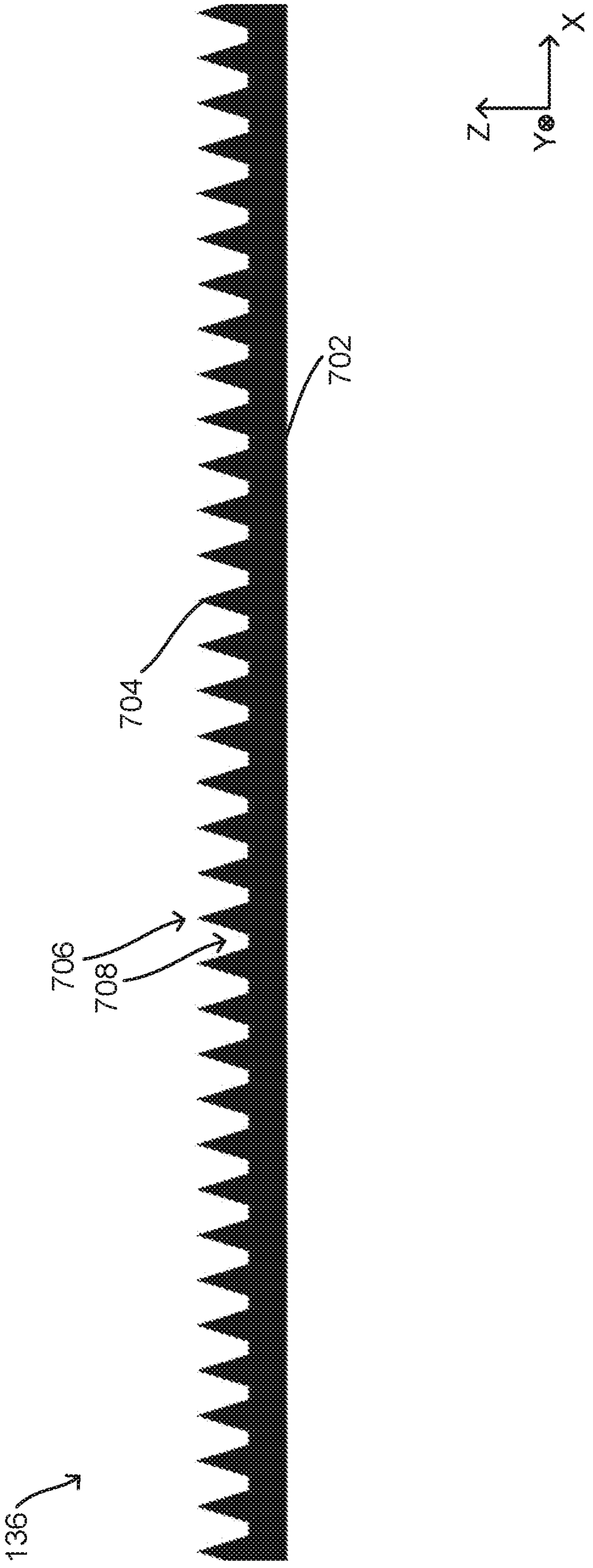
FIG. 7 is a diagram illustrating an example anti-reflective layer in accordance with some embodiments.

Each of the anti-reflective layers 136 is characterized by area enlarging elements on its top surface. FIG. 7 is a diagram illustrating an example anti-reflective layer in accordance with some embodiments. In the example shown in FIG. 7, the anti-reflective layer 136 includes a base structure 702 and multiple area enlarging elements 704 disposed on the top surface of the base structure 702. The area enlarging elements 704 are arranged in a periodic manner in the X-direction. The area enlarging elements 704 are operable to enlarge the surface area of the anti-reflective layer 136, thereby increasing the light absorption of the anti-reflective layer 136.

In the example shown in FIG. 7, the area enlarging elements 704 are protrusions protruding from the top surface of the base structure 702. As a result, peaks 706 and valleys 708 are formed at the top surface of the anti-reflective layer 136, which may establish a saw-tooth profile in a cross-sectional view (e.g., in the X-Z plane shown in FIG. 7). The surface area of the anti-reflective layer 136 is enlarged accordingly.

The peaks 706 may be triangular, pyramid-shaped, or cone-shaped, among others, in various embodiments. In other embodiments, the peaks 706 can also have a width, in the X-direction. In other embodiments, the peaks 706 may come to a point or have a rounded top. The valleys 708 may be flat-bottomed or rounded, among others, in various embodiments. In some embodiments, neighboring peaks 706 may have the same heights (in the Z-direction shown in FIG. 7) and/or widths (in the X-direction shown in FIG. 7) as one another; neighboring valleys 708 may also have the same depths (in the Z-direction shown in FIG. 7) and/or widths (in the X-direction shown in FIG. 7) as one another. In other embodiments, the peaks 706 can also have different heights and/or different widths from one another; the valleys 708 can have different depths and/or widths from one another. In some embodiments, the peaks 706 and/or valleys 708 may follow a random distribution of heights and/or widths or other distributions (e.g., a Gaussian distribution). In one implementation, the anti-reflective layer 136 is fabricated using high density plasma chemical vapor deposition (HDPCVD), which will be described below with reference to FIG. 9B.

As shown in FIG. 6, the anti-reflective layers 136 disposed in the M1 layer and the M2 layer are operable to absorb the stray light that propagates through or penetrates the light blocking features 130 disposed in the M3 layer. Specifically, the light blocking features 130 in the M3 layer are operable to block the stray light (denoted as the blocked stray light 142 in FIG. 6) propagating through the gaps between two neighboring ones of the routing features 124 in the M4 layer. Even if there is still some stray light propagating through the light blocking features 130 in the M3 layer, the anti-reflective layers 136 disposed in the M2 layer is operable to absorb the stray light (denoted as the absorbed stray light 144 in FIG. 6). Likewise, even if there is still some stray light propagating through the anti-reflective layers 136 disposed in the M2 layer, the anti-reflective layers 136 disposed in the M1 layer is operable to absorb the stray light (denoted as the absorbed stray light 144 in FIG. 6).

As such, the light blocking features 130 disposed in the M3 layer serve as the first line of defense to prevent the stray light from reaching the control transistors 110; the low anti-reflective layer 136 disposed in the M2 layer serves as the second line of defense to prevent the stray light from reaching the control transistors 110; the anti-reflective layer 136 disposed in the M1 layer serves as the third line of defense to prevent the stray light from reaching the control transistors 110. Therefore, the light blocking features 130 disposed in the M3 layer and the anti-reflective layers 136 disposed in the M2 and M1 layers, collectively, significantly prevent the stray light from reaching the control transistors 110. The stability of the display device 100' is enhanced accordingly.

In some embodiments, the routing features 124 may comprise Ti. In some embodiments, the routing features 124 may comprise Ta. In some embodiments, the routing features 124 may comprise Al. In some embodiments, the routing features 124 may comprise AlCu. In some embodiments, the routing features 124 may comprise AlSiCu. In some embodiments, the routing features 124 may comprise Cu. In some embodiments, the routing features 124 may comprise W.

In some implementations, the light blocking features 130 may comprise the same material as the routing features 124. In some examples, the light blocking features 130 may comprise Ti, Ta, Al, AlCu, AlSiCu, Cu, or W. Since the light blocking features 130 may comprise the same material as the routing features 124, they can be fabricated simultaneously (i.e., in the same step using one mask) in a cost-effective manner. As explained above, the difference lies in that the routing features are electrically connected between at least one of the control transistors 110 and the luminous device layer 114, whereas the light blocking features 130 are not (sometimes referred to as "floating features" in the MLI structure 112). In other implementations, the light blocking features 130 and the routing features 124 may comprise different materials.

In some embodiments, the dielectric layers 120 may comprise low-k dielectric materials (materials having a dielectric constant lower than silicon dioxide). In other embodiments, the dielectric layers 120 may comprise extremely low-k (ELK) dielectric materials (materials having a dielectric constant lower than less than 3.9). In some examples, the dielectric layers 120 may comprise silicon nitride ($Si_3N_4$), undoped silicon glass (USG), phosphosilicate glass (PSG), and silicon oxynitride ($SiN_xO_y$).

Each of the anti-reflective layers 136 may comprise suitable materials, such as low-k dielectric materials, or comprise extremely low-k (ELK) dielectric materials, as needed in various embodiments. In one embodiment, each of the anti-reflective layers 136 may comprise a material characterized by a relatively low reflectance. In one embodiment, each of the anti-reflective layers 136 may comprise silicon oxynitride ($SiN_xO_y$). In one example, each of the anti-reflective layers 136 comprises oxygen-rich $SiN_xO_y$. In one example, each of the anti-reflective layers 136 comprises nitrogen-rich $SiN_xO_y$.

While the anti-reflective layers 136 are disposed in the M2 layer and the M1 layer in the example shown in FIG. 6, this is not intended to be limiting, and other configurations can be employed as needed. In one embodiment, a single anti-reflective layer 136 is disposed in the MLI structure 112. In another embodiment, more than two anti-reflective layers 136 are disposed in the MLI structure 112. In some embodiments, the light block features 130 are disposed in the immediate next conductive layer (e.g., the M3 layer in the example shown in FIG. 6) of the top layer (e.g., the M2 layer in the example shown in FIG. 6) of the anti-reflective layers 136. In other embodiments, the light block features 130 are not disposed in the immediate next conductive layer (e.g., the M3 layer in the example shown in FIG. 6) of the top layer (e.g., the M2 layer in the example shown in FIG. 6) of the anti-reflective layers 136. In other words, there is a "gap" between the conductive layer(s) where the light blocking features 130 are disposed and the top layer of the anti-reflective layers 136. One of ordinary skill in the art would recognize many variations, modifications, and alternatives.

Also, like the concepts shown in FIGS. 3A-3B, the anti-reflective layers 136 may extend in both the X-direction and the Y-direction shown in FIG. 6 as needed. In one embodiment, the anti-reflective layers 136 occupy the whole area of the conductive layers (e.g., the M1 layer and the M2 layer in the example shown in FIG. 6) in the X-Y plane except areas where the routing features 124 are disposed.

Figure 8A:
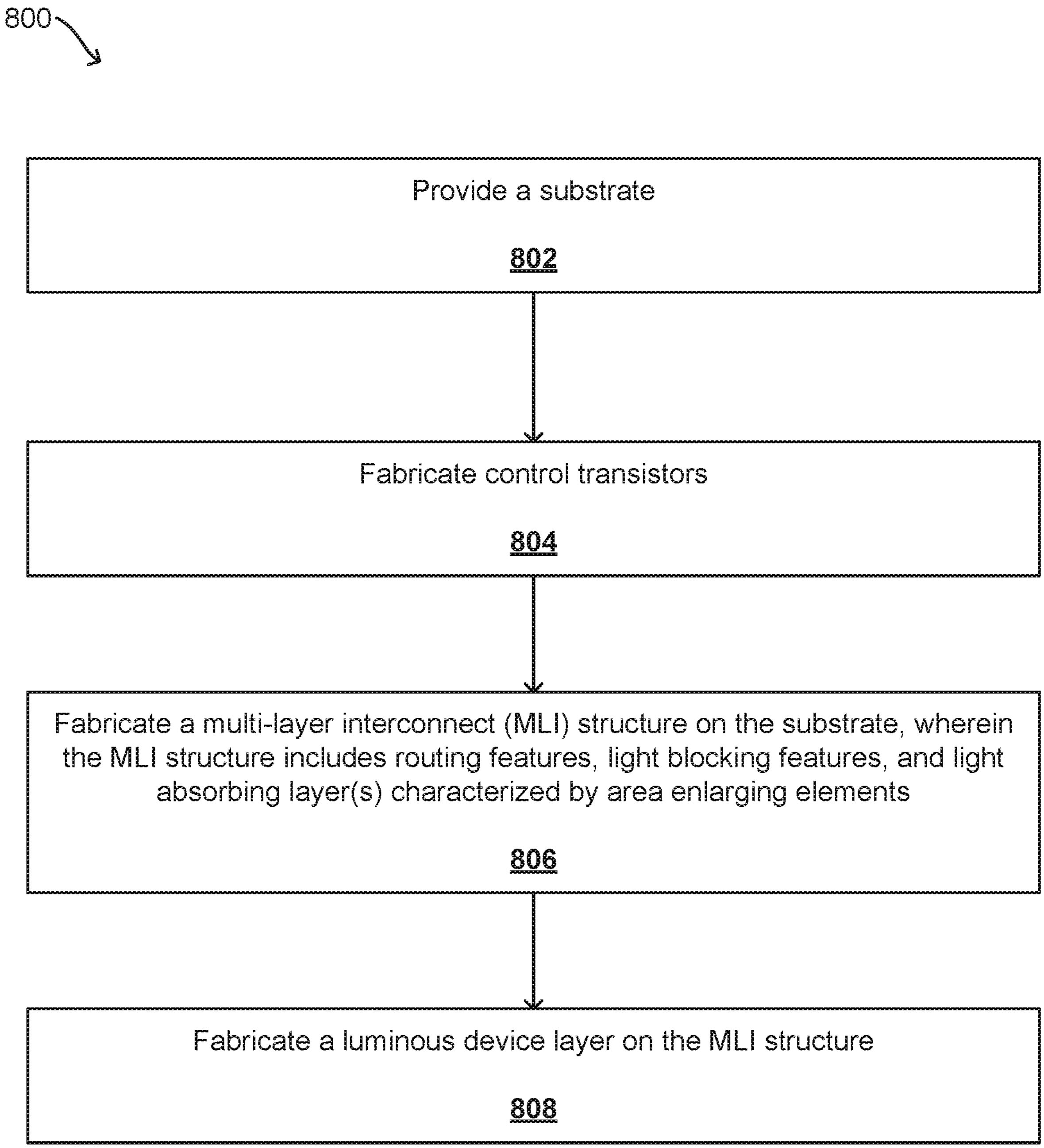
FIG. 8A is a flowchart diagram illustrating an example method for fabricating a display device with light blocking features and anti-reflective layers in accordance with some embodiments.

FIG. 8A is a flowchart diagram illustrating an example method for fabricating a display device with light blocking features and anti-reflective layers in accordance with some embodiments. In the example shown in FIG. 8A, the method 800 includes operations 802, 804, 806, and 808. Additional operations may be performed.

At operation 802, a substrate (e.g., the substrate 108 shown in FIG. 6) is provided. In one embodiment, the substrate is a silicon substrate. It should be understood that other types of substrates may be employed in other embodiments.

At operation 804, control transistors (e.g., the control transistors 110*a* and 110*b* shown in FIG. 6) are fabricated using FEOL processes in the substrate. The number of control transistors corresponds to the number of sub-pixels. In some examples, the control transistors are FinFETs. In other examples, the control transistors are GAA FETs. In yet other examples, the control transistors are MBC FETs. It should be understood that these examples are not intended to be limiting and other types of transistors may be employed as well.

At operation 806, an MLI structure (e.g., the MLI structure 112 shown in FIG. 4) is fabricated on the substrate. The MLI structure includes routing features (e.g., the routing features 124 shown in FIG. 4), light blocking features (e.g., the light blocking features 130 shown in FIG. 4), and anti-reflective layers (e.g., the anti-reflective layers 136 shown in FIG. 6). The light blocking features and the anti-reflective layers are operable to block the stray light or prevent the stray light from reaching the control transistors. The anti-reflective layers are disposed in conductive layers under the conductive layers where the light blocking features are disposed. As mentioned above, in one implementation, the anti-reflective layers are fabricated using HDPCVD, which will be described below with reference to FIG. 9B.

At operation 808, a luminous device layer (e.g., the luminous device layer 114 shown in FIG. 6) is fabricated on the MLI structure. The luminous device layer receives the currents provided by the control transistors through the MLI structure. In one embodiment, the luminous device layer is an OLED layer. In some embodiments, the OLED layer has a multi-layer structure, including a cathode layer, an organic emitter layer, an anode layer, and a glass layer, among other components. The organic emitter layer is an emissive electroluminescent layer which is a film of organic material that emits light in response to the currents provided by the control transistors. The film of organic material is situated between two electrodes (i.e., the cathode layer and the anode layer).

Example Method for Fabricating an Anti-Reflective Layer in an MLI Structure

Figure 8B:
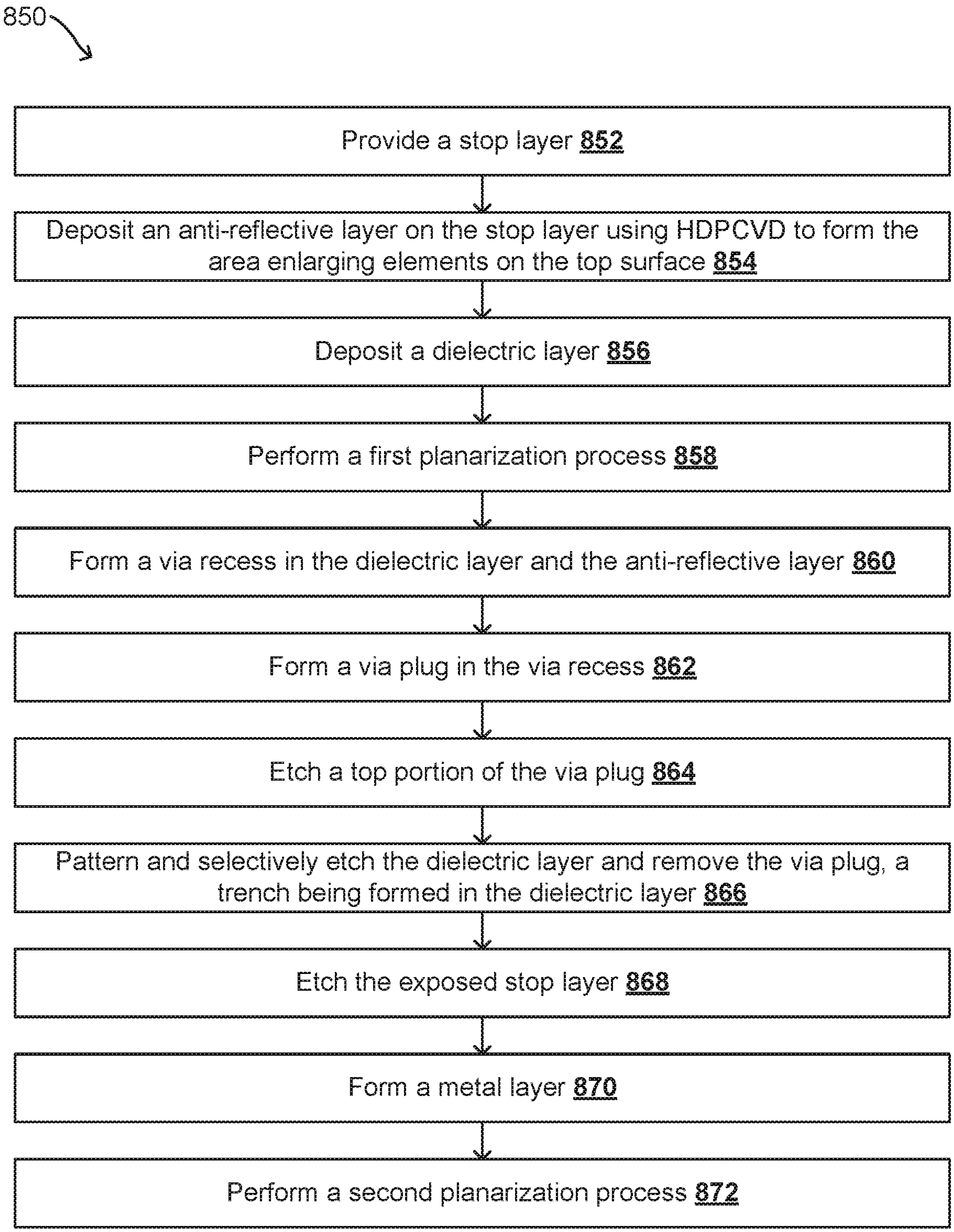
FIG. 8B is a flowchart diagram illustrating an example method for fabricating an anti-reflective layer in an MLI structure in accordance with some embodiments.
Figure 9A:
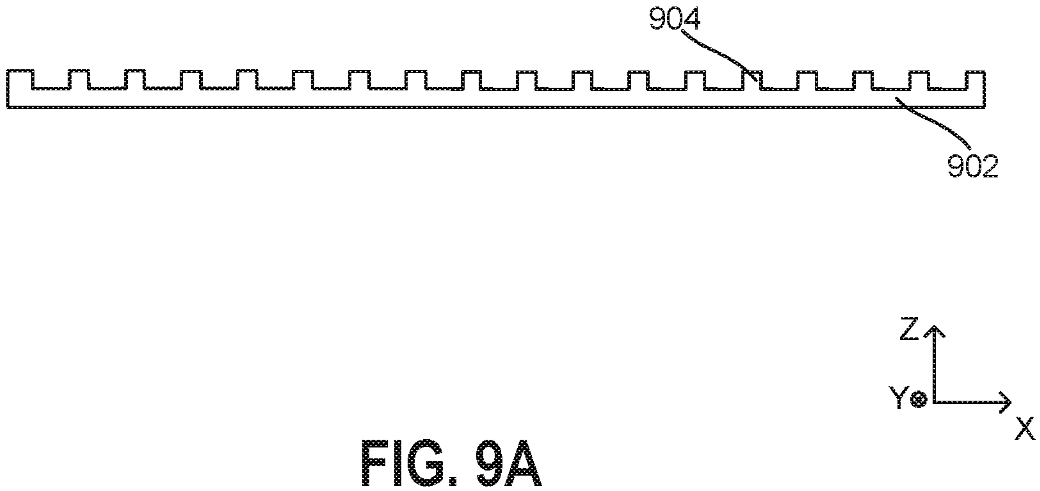
FIGS. 9A-9J are cross-sectional diagrams illustrating a structure at various stages in accordance with some embodiments.
Figure 9B:
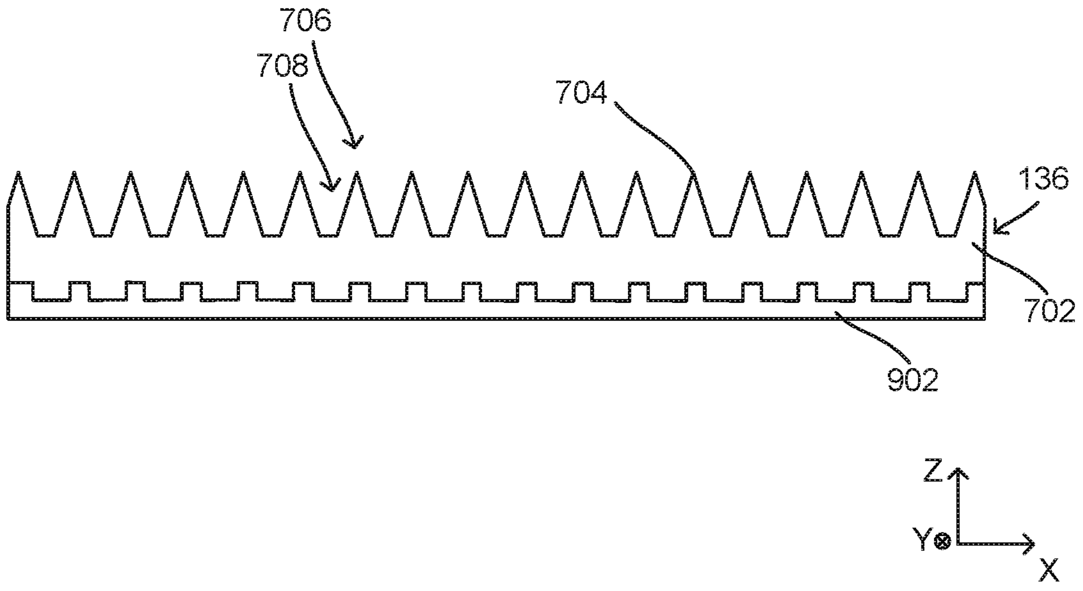
Figure 9C:
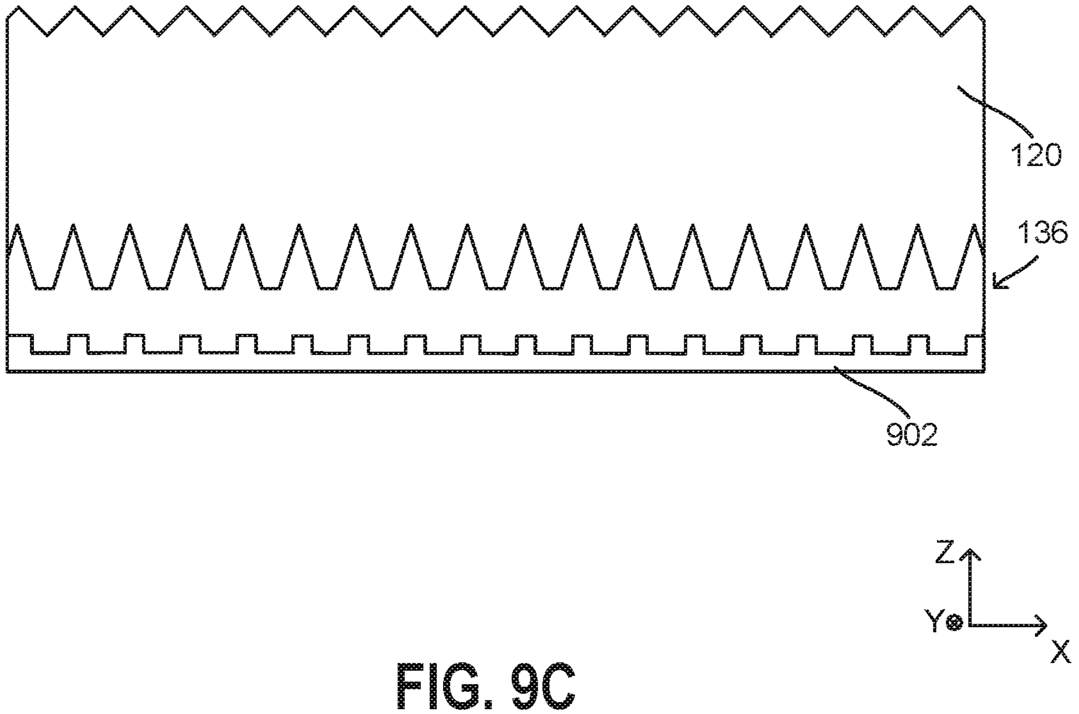
Figure 9D:
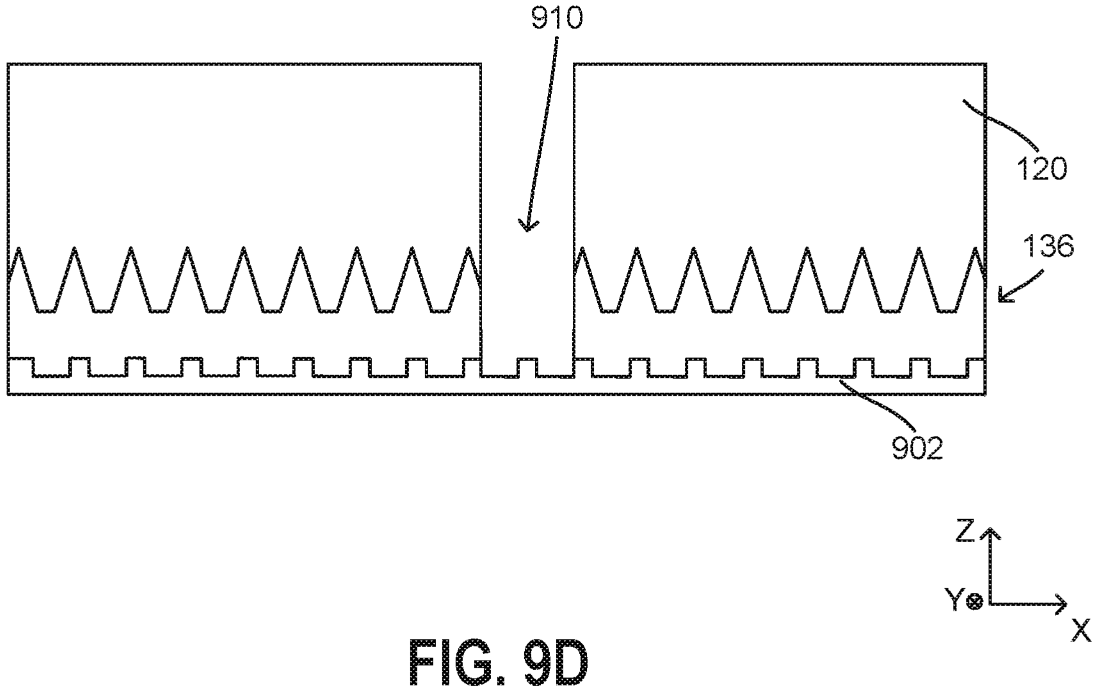
Figure 9E:
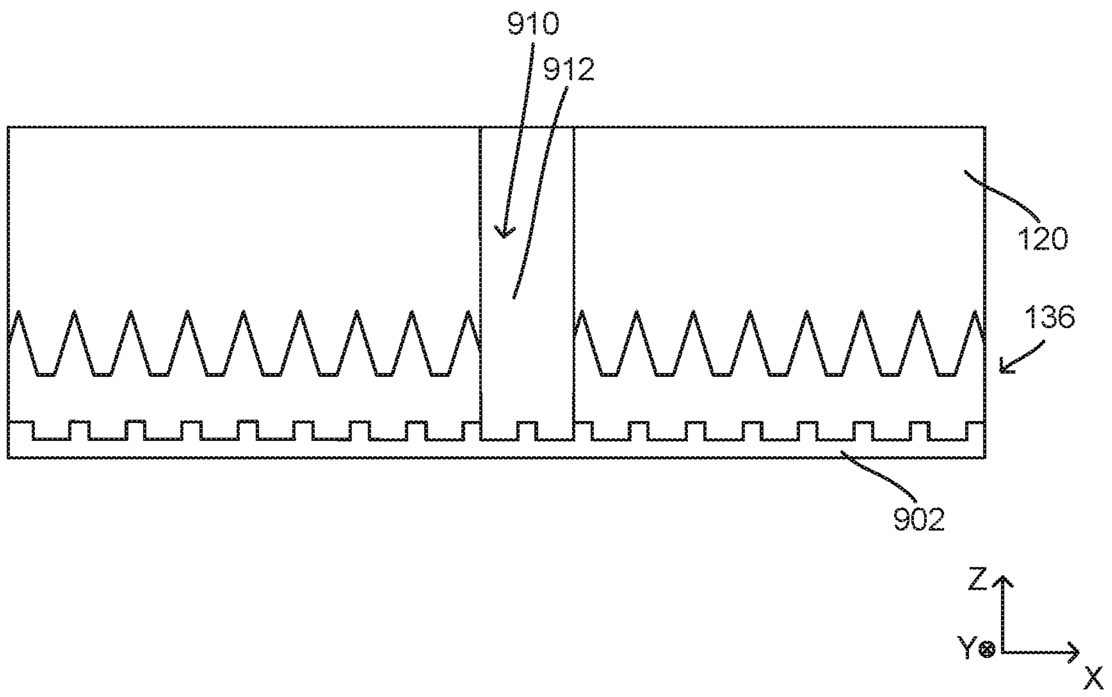
Figure 9F:
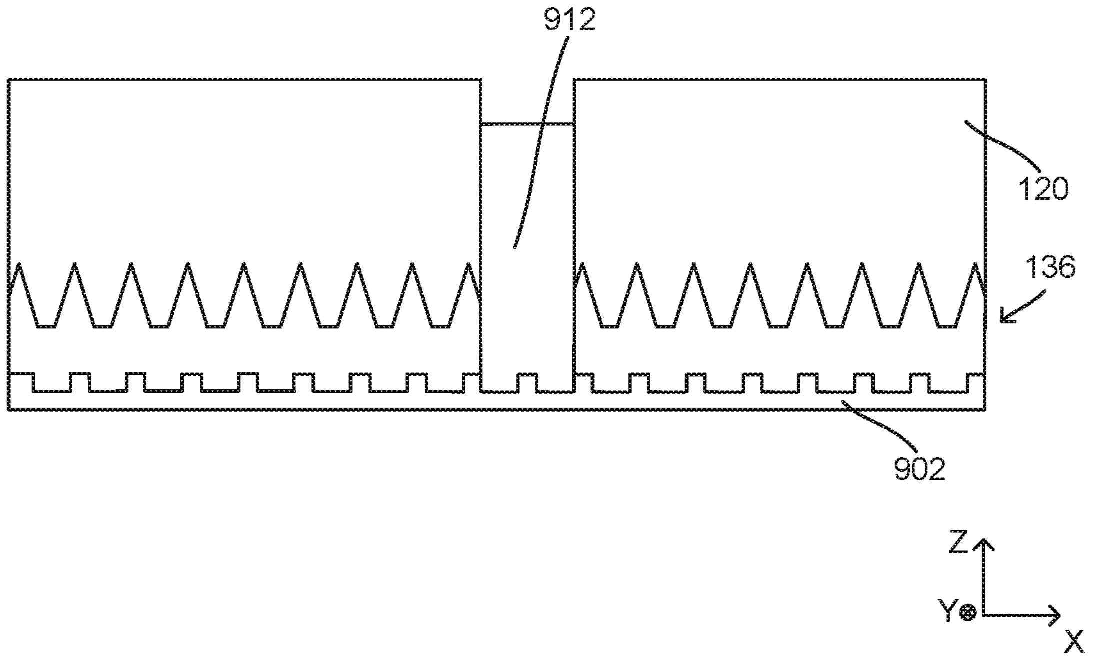
Figure 9G:
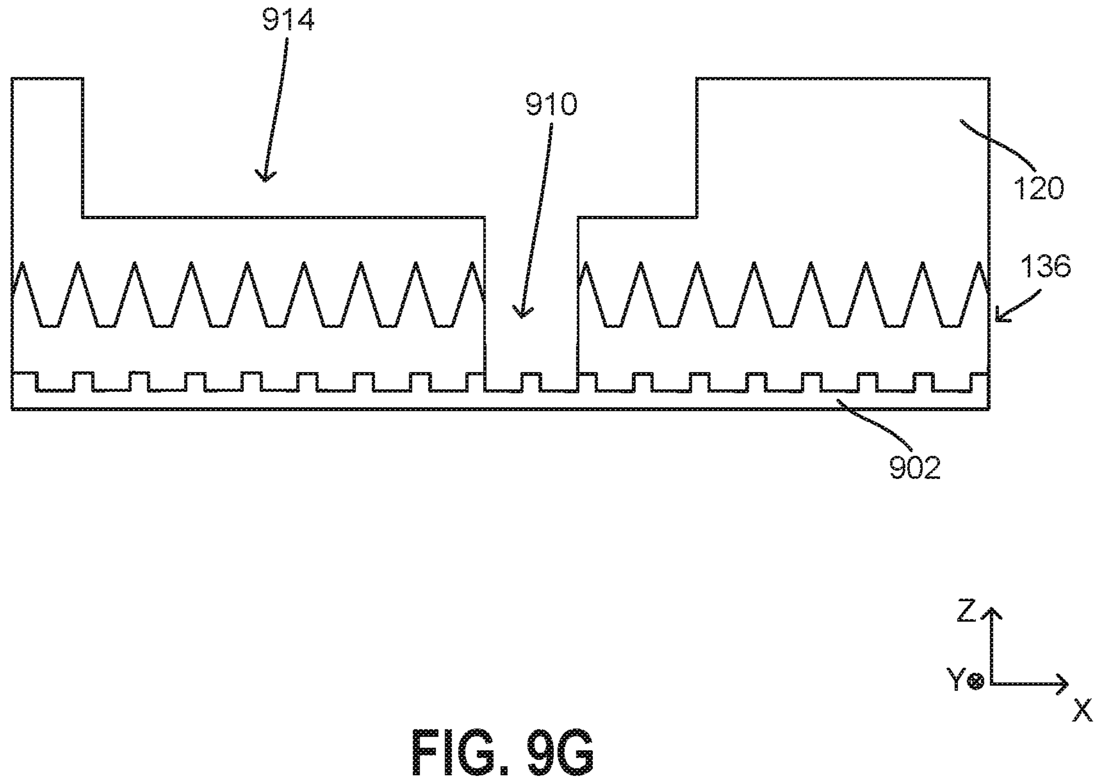
Figure 9H:
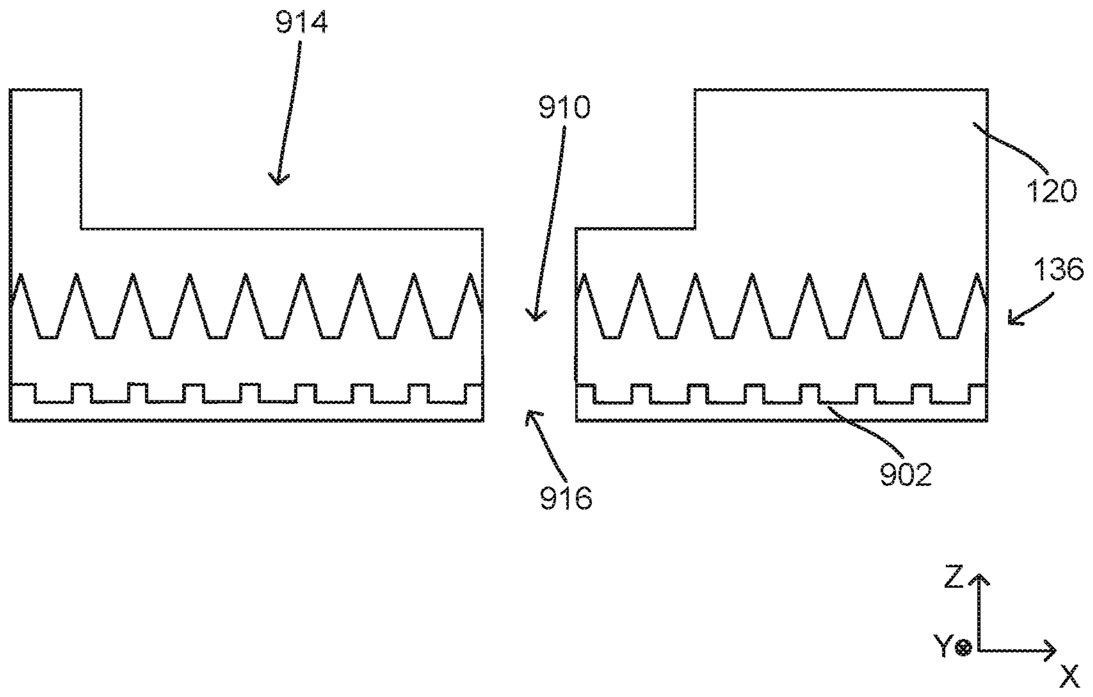
Figure 9I:
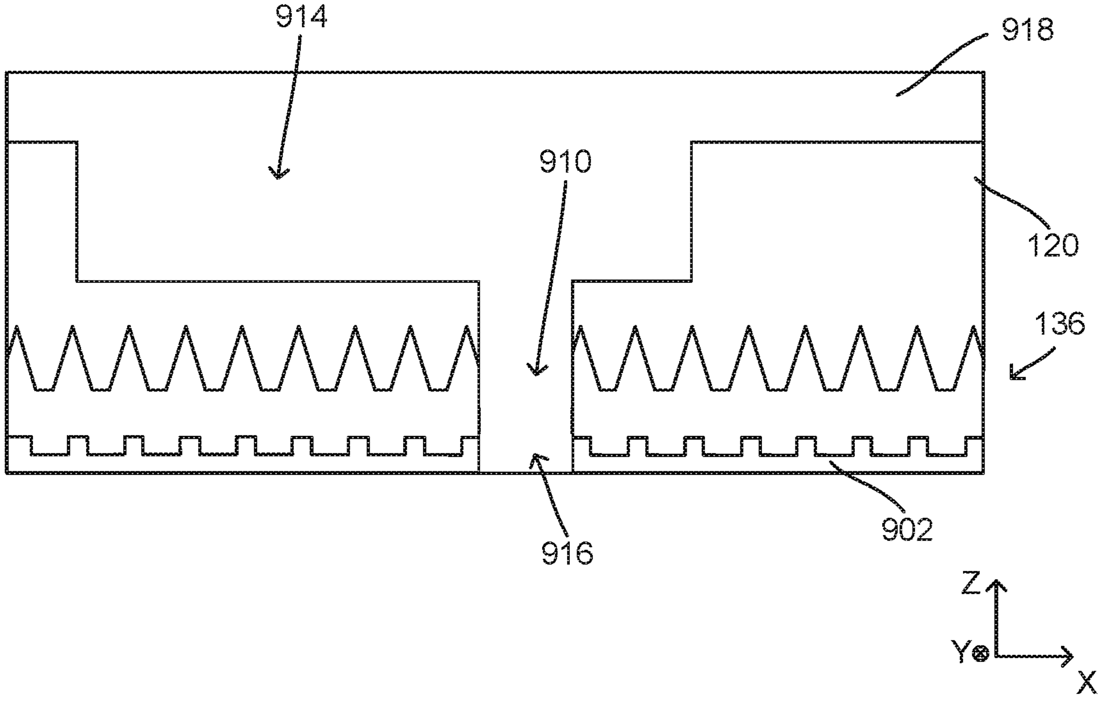
Figure 9J:
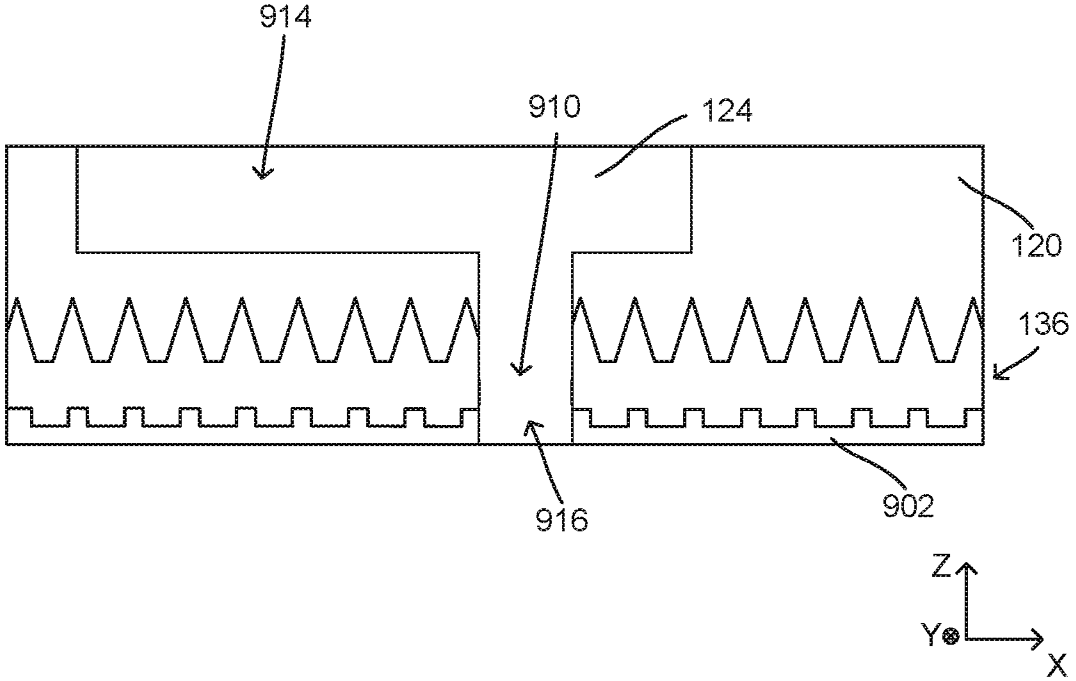

FIG. 8B is a flowchart diagram illustrating an example method for fabricating an anti-reflective layer in an MLI structure in accordance with some embodiments. In the example shown in FIG. 8B, the method 850 includes operations 852, 854, 856, 858, 860, 862, 864, 866, 868, 870, and 872. Additional operations may be performed. FIGS. 9A-9J are cross-sectional diagrams illustrating a structure at various stages in accordance with some embodiments.

At operation 852, a stop layer is provided. In the example shown in FIG. 9A, a stop layer 902 is formed. The stop layer 902 has a relatively high etchant selectivity with respect to the anti-reflective layer and the dielectric layer in subsequent etching processes, thereby protecting the structures under the stop layer 902 from these subsequent etching processes. In one embodiment, the stop layer 902 is characterized by multiple stop layer protrusions 904 at the top surface of the stop layer 902. In one implementation, the stop layer protrusions 904 are formed by patterning and selectively etching a portion of a flat stop layer 902. In other embodiments, the stop layer 902 may have a flat top surface.

At operation 854, an anti-reflective layer is deposited on the stop layer using HDPCVD. In the example shown in FIG. 9B, the anti-reflective layer 136 is characterized by multiple area enlarging elements 704. In some embodiments, the area enlarging elements 704 are protrusions protruding upwardly in the Z-direction from the base structure 702. As a result, peaks 706 and valleys 708 are formed at the top surface of the anti-reflective layer 136, which may establish a saw-tooth profile in a cross-sectional view (e.g., in the X-Z plane shown in FIG. 9B). The surface area of the anti-reflective layer 136 is enlarged accordingly.

HDPCVD is a special form of plasma-enhanced CVD (PECVD) that employs, for example, an inductively coupled plasma (ICP) source to generate a higher plasma density than that of a standard parallel plate PECVD system. As a result of the higher plasma density, plasmas bombard the surface of the film that is being deposited. Accordingly, an HDPCVD process is sometimes considered a combination of a CVD process and a sputtering process.

The stop layer protrusions 904 can facilitate the formation of a non-flat top surface of the film that is being deposited, whereas the plasma bombardment can cause the formation of the area enlarging elements 704, which are protrusions, due to the relatively sharp cut at the top due to the plasma bombardment. While HDPCVD is described as an example implementation, it should be understood that other processes may be employed to form the anti-reflective layer 136 characterized by the area enlarging elements 704.

At operation 856, a dielectric layer is deposited. In the example shown in FIG. 9C, the dielectric layer 120 is formed on the anti-reflective layer 136. Since the anti-reflective layer 136 is characterized by multiple area enlarging elements 704, the top surface of the dielectric layer 120 is non-flat.

At operation 858, a first planarization process is performed. In one implementation, the first planarization process is a chemical-mechanical polishing (CMP) process. At operation 860, a via recess is formed in the dielectric layer and the anti-reflective layer. In the example shown in FIG. 9D, the top surface of the dielectric layer 120 becomes flat after the first planarization process, and a via recess 910 is formed by etching the dielectric layer 120 and the anti-reflective layer 136. The etching stops at the stop layer 902.

At operation 862, a via plug is formed in the via recess. In the example shown in FIG. 9E, a via plug 912 is formed in the via recess 910. In one implementation, the via plug 912 comprises a photoresist. The via plug 912 provides some temporary protection for the bottom of the via recess 910 in subsequent etching of the dielectric layer 120.

At operation 864, a top portion of the via plug is etched. In the example shown in FIG. 9F, a top portion of the via plug 912 is etched.

At operation 866, the dielectric layer is patterned and selectively etched to form a trench, and the via plug is then removed. In one implementation, the via plug is removed when the photoresist used at operation 866 is removed. In the example shown in FIG. 9G, both the trench 914 and the via recess 910 is formed after operation 866, and they correspond to and accommodate the routing features to be deposited subsequently.

At operation 868, the exposed stop layer is etched. In the example shown in FIG. 9H, an opening 916 at the stop layer 902 is formed. As such, the routing features to be deposited can electrically connect structures below the etch stop layer 902 and structures above the via recess 910.

At operation 870, a metal layer is formed. In one implementation, the metal layer is formed using electroplating (i.e., electrochemical deposition (ECD)). In the example shown in FIG. 9I, the metal layer 918 fills the opening 916, the via recess 910, and the trench 914 after operation 810.

At operation 872, a second planarization process is performed. In one implementation, the second planarization process is a CMP process. In the example shown in FIG. 9J, the second planarization process removes excess metal layer 918 outside the trench 914, thus forming the intended routing features 124, for example, in the trench 914 and the via recess 910.

SUMMARY

In accordance with some aspects of the disclosure, a display device is provided. The display device includes: a substrate; a plurality of control transistors disposed in the substrate; a multi-layer interconnect (MLI) structure on the substrate; and a luminous device layer disposed on the MLI structure. The luminous device layer includes a plurality of sub-pixels corresponding to the plurality of control transistors, respectively. The MLI structure includes a plurality of routing features and at least one light blocking feature, and the plurality of routing features electrically connect each of the plurality of control transistors to the corresponding sub-pixel, and the at least one light blocking feature is operable to block stray light generated by the luminous device layer.

In accordance with some aspects of the disclosure, a display device is provided. The display device includes: a substrate; a plurality of control transistors disposed in the substrate; a multi-layer interconnect (MLI) structure on the substrate; and a luminous device layer disposed on the MLI structure. The luminous device layer includes a plurality of sub-pixels corresponding to the plurality of control transistors, respectively. The MLI structure includes a plurality of routing features, at least one light blocking feature, and at least one light absorbing layer. The plurality of routing features electrically connect each of the plurality of control transistors to the corresponding sub-pixel, and the at least one light blocking feature is operable to block stray light generated by the luminous device layer, and the at least one light absorbing layer is operable to absorb the stray light.

In accordance with some aspects of the disclosure, a method of fabricating a display device is provided. The method includes the following steps: providing a substrate; fabricating a plurality of control transistors disposed in the substrate; fabricating a multi-layer interconnect (MLI) structure on the substrate, the MLI structure comprising comprises a plurality of routing features and at least one light blocking feature operable to block stray light; and fabricating a luminous device layer disposed on the MLI structure, wherein the luminous device layer comprises a plurality of sub-pixels corresponding to the plurality of control transistors, respectively, and wherein the stray light is generated by the luminous device layer, and wherein the plurality of routing features electrically connect each of the plurality of control transistors to the corresponding sub-pixel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display device comprising:

a substrate;

a plurality of control transistors disposed in the substrate;

a multi-layer interconnect (MLI) structure on the substrate, wherein the MLI structure comprises a plurality of conductive layers disposed in a plurality of dielectric layers, and a plurality of routing features comprising horizontal routing features disposed in the plurality of conductive layers and vertical routing features electrically connecting the horizontal routing features; and a luminous device layer disposed on the MLI structure, wherein the luminous device layer comprises a plurality of sub-pixels corresponding to the plurality of control transistors, respectively, and wherein the MLI structure comprises at least one light blocking feature, and the plurality of routing features electrically connect each of the plurality of control transistors to the corresponding sub-pixel, and the at least one light blocking feature is operable to block stray light generated by the luminous device layer.

2. The display device of claim 1, wherein the at least one light blocking feature is not electrically connected with the routing features.

3. The display device of claim 2, wherein the at least one light blocking feature is not electrically connected to any of the plurality of control transistors.

4. The display device of claim 1, wherein the at least one light blocking feature is operable to block the stray light by reflecting the stray light.

5. The display device of claim 1, wherein the at least one light blocking feature and the plurality of routing features comprise a same material.

6. The display device of claim 1, wherein the at least one light blocking feature comprises a plurality of light blocking features disposed in one of the conductive layers.

7. The display device of claim 1, wherein the at least one light blocking feature comprises a plurality of light blocking features disposed in two or more conductive layers.

8. The display device of claim 1, wherein the at least one light blocking feature is disposed in a first conductive layer under a gap, in a first horizontal direction, between two of the horizontal routing features disposed in a second conductive layer, the second conductive layer is above the first conductive layer.

9. The display device of claim 8, wherein the second conductive layer is an immediate next layer of the first conductive layer.

10. The display device of claim 1, further comprising:

at least one light absorbing layer disposed in the MLI structure operable to absorb the stray light.

11. The display device of claim 10, wherein the at least one light absorbing layer comprises at least one low reflectance layer comprising a material characterized by a relatively low reflectance as compared to a reflectance of the plurality of dielectric layers.

12. The display device of claim 10, wherein the at least one light absorbing layer comprises at least one anti-reflective layer characterized by a plurality of area enlarging elements operable to increase absorption of the stray light.

13. A display device comprising:

a substrate;

a plurality of control transistors disposed in the substrate;

a multi-layer interconnect (MLI) structure on the substrate, wherein the MLI structure comprises a plurality of conductive layers disposed in a plurality of dielectric layers, and a plurality of routing features comprising horizontal routing features disposed in the plurality of conductive layers and vertical routing features electrically connecting the horizontal routing features; and a luminous device layer disposed on the MLI structure, wherein the luminous device layer comprises a plurality of sub-pixels corresponding to the plurality of control transistors, respectively, and wherein the MLI structure comprises at least one light blocking feature and at least one light absorbing layer, and wherein the plurality of routing features electrically connect each of the plurality of control transistors to the corresponding sub-pixel, and the at least one light blocking feature is operable to block stray light generated by the luminous device layer, and the at least one light absorbing layer is operable to absorb the stray light.

14. The display device of claim 13, wherein the at least one light blocking feature is not electrically connected with the routing features.

15. The display device of claim 14, wherein the at least one light absorbing layer comprises at least one low reflectance layer comprising a material characterized by a relatively low reflectance as compared to a reflectance of the plurality of dielectric layers.

16. The display device of claim 14, wherein the at least one light absorbing layer comprises at least one anti-reflective layer characterized by a plurality of area enlarging elements operable to increase absorption of the stray light.

17. A display device comprising:

a substrate;

a plurality of control transistors disposed in the substrate;

a multi-layer interconnect (MLI) structure on the substrate, the MLI structure comprising a plurality of conductive layers disposed in a plurality of dielectric layers, and a plurality of routing features comprising horizontal routing features disposed in the plurality of conductive layers and vertical routing features electrically connecting the horizontal routing features; and a luminous device layer disposed on the MLI structure, wherein the luminous device layer comprises a plurality of sub-pixels corresponding to the plurality of control transistors, respectively, wherein the MLI structure comprises:

the plurality of routing features electrically connecting each of the plurality of control transistors to the corresponding sub-pixel; and at least one anti-reflective layer disposed in one of the plurality of conductive layers, the at least one anti-reflective layer being characterized by a plurality of area enlarging elements operable to increase absorption of stray light generated by the luminous device layer.

18. The display device of claim 17, further comprising at least one light blocking feature disposed in one of the plurality of conductive layers, wherein the at least one light blocking feature is not electrically connected with the plurality of routing features.

19. The display device of claim 17, wherein the at least one anti-reflective layer is disposed in the MLI structure under a gap between two of the horizontal routing features disposed in a first conductive layer, and the first conductive layer is above the at least one anti-reflective layer in the MLI structure.

20. The display device of claim 17, wherein the at least one anti-reflective layer is disposed in the MLI structure to fill a space between two of the vertical routing features disposed in a first conductive layer.

* * * * *